(12) United States Patent
Morikawa et al.

(10) Patent No.: US 11,293,096 B2
(45) Date of Patent: Apr. 5, 2022

(54) SUBSTRATE PROCESSING APPARATUS, METHOD FOR MANUFACTURING SEMICONDUCTOR DEVICE AND VAPORIZER

(71) Applicant: HITACHI KOKUSAI ELECTRIC INC., Tokyo (JP)

(72) Inventors: Atsushi Morikawa, Toyama (JP); Masakazu Shimada, Toyama (JP); Takeshi Kasai, Toyama (JP); Kenichi Suzaki, Toyama (JP); Hirohisa Yamazaki, Toyama (JP); Yoshimasa Nagatomi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 326 days.

(21) Appl. No.: 15/870,283

(22) Filed: Jan. 12, 2018

(65) Prior Publication Data
US 2018/0135176 A1   May 17, 2018

Related U.S. Application Data

(63) Continuation of application No. PCT/JP2016/059002, filed on Mar. 22, 2016.

(51) Int. Cl.
*H01L 21/02*   (2006.01)
*H01L 21/67*   (2006.01)
(Continued)

(52) U.S. Cl.
CPC ........ *C23C 16/4486* (2013.01); *C23C 16/405* (2013.01); *C23C 16/4481* (2013.01);
(Continued)

(58) Field of Classification Search
CPC ........ C23C 16/45563; C23C 16/45578; C23C 16/45544; C23C 16/4486;
(Continued)

(56) References Cited

U.S. PATENT DOCUMENTS 4,726,686 A * 2/1988 Wolf ..................... F02M 19/03
366/165.1
5,059,357 A * 10/1991 Wolf ..................... F02M 19/03
261/53
(Continued)

FOREIGN PATENT DOCUMENTS

JP   2000-017438 A   1/2000
JP   2005-109349 A   4/2005
(Continued)

OTHER PUBLICATIONS

Translation of Takamatsu et al JP 2000-17438 A ; Jan. 18, 2000.*
(Continued)

*Primary Examiner* — Jeffrie R Lund
(74) *Attorney, Agent, or Firm* — Volpe Koenig

(57) ABSTRACT

A vaporization system includes a vaporization chamber having a first portion and a second portion. A first fluid supply part is connected to the first portion of the vaporization chamber, and configured to supply a mixed fluid in which a first carrier gas and a liquid precursor are mixed, toward the second portion. A second fluid supply part is configured to supply a second carrier gas toward the mixed fluid at the second portion.

12 Claims, 15 Drawing Sheets

(51) Int. Cl.
- *C23C 16/455* (2006.01)
- *C23C 16/40* (2006.01)
- *C23C 16/458* (2006.01)
- *C23C 16/448* (2006.01)

(52) U.S. Cl.
CPC .... *C23C 16/4587* (2013.01); *C23C 16/45544* (2013.01); *C23C 16/45561* (2013.01); *C23C 16/45563* (2013.01); *C23C 16/45578* (2013.01); *H01L 21/0228* (2013.01); *H01L 21/02189* (2013.01); *H01L 21/67017* (2013.01); *H01L 21/67098* (2013.01)

(58) Field of Classification Search
CPC ............ C23C 16/45561; C23C 16/405; C23C 16/4587; C23C 16/4481; H01L 21/02189; H01L 21/0228; H01L 21/67017; H01L 21/67098
See application file for complete search history.

(56) References Cited

U.S. PATENT DOCUMENTS

| | | | | |
|---|---|---|---|---|
| 5,372,754 A * | 12/1994 | Ono | ................ | B01F 3/022 118/726 |
| 5,653,813 A * | 8/1997 | Benzing | ............. | C23C 16/4486 118/726 |
| 5,711,816 A * | 1/1998 | Kirlin | ................ | C23C 16/18 118/726 |
| 6,012,647 A * | 1/2000 | Ruta | ................ | B05B 7/066 239/132.1 |
| 6,224,681 B1 * | 5/2001 | Sivaramakrishnan | .. | B01F 3/022 118/726 |
| 6,244,575 B1 * | 6/2001 | Vaartstra | ............. | C23C 16/4486 118/708 |
| 6,277,201 B1 * | 8/2001 | Nishikawa | ........... | C23C 16/4405 118/723 VE |
| 7,547,003 B2 * | 6/2009 | Okabe | ................ | C23C 16/405 118/726 |
| 7,672,575 B2 * | 3/2010 | Kato | ................ | C23C 16/4481 392/386 |
| 2004/0083963 A1 * | 5/2004 | Dando | ................ | C23C 16/4481 118/715 |
| 2006/0051940 A1 * | 3/2006 | Todd | ................ | C23C 16/4481 438/478 |
| 2007/0151518 A1 * | 7/2007 | Kato | ................ | C23C 16/4481 118/726 |
| 2011/0192909 A1 * | 8/2011 | Liu | ................ | C23C 16/4486 239/4 |
| 2014/0130740 A1 * | 5/2014 | Hsu | ................ | H05H 1/42 118/722 |
| 2014/0182515 A1 * | 7/2014 | Yamazaki | ........... | C23C 16/4481 118/722 |
| 2018/0135176 A1 * | 5/2018 | Morikawa | ............ | C23C 16/405 |

FOREIGN PATENT DOCUMENTS

| | | |
|---|---|---|
| JP | 2013-023700 A | 2/2013 |
| JP | 2014-192258 A | 10/2014 |
| KR | 10-2007-0087058 A | 8/2007 |
| KR | 10-2008-0085542 A | 9/2008 |

OTHER PUBLICATIONS

International Search Report dated Jun. 14, 2016 of International Application No. PCT/JP2016/059002.
Korean Office Action dated Dec. 26, 2019 for the Korean Patent Application No. 10-2018-7000793.
Korean Office Action dated Jun. 16, 2019 for the Korean Patent Application No. 10-2018-7000793.

* cited by examiner

108

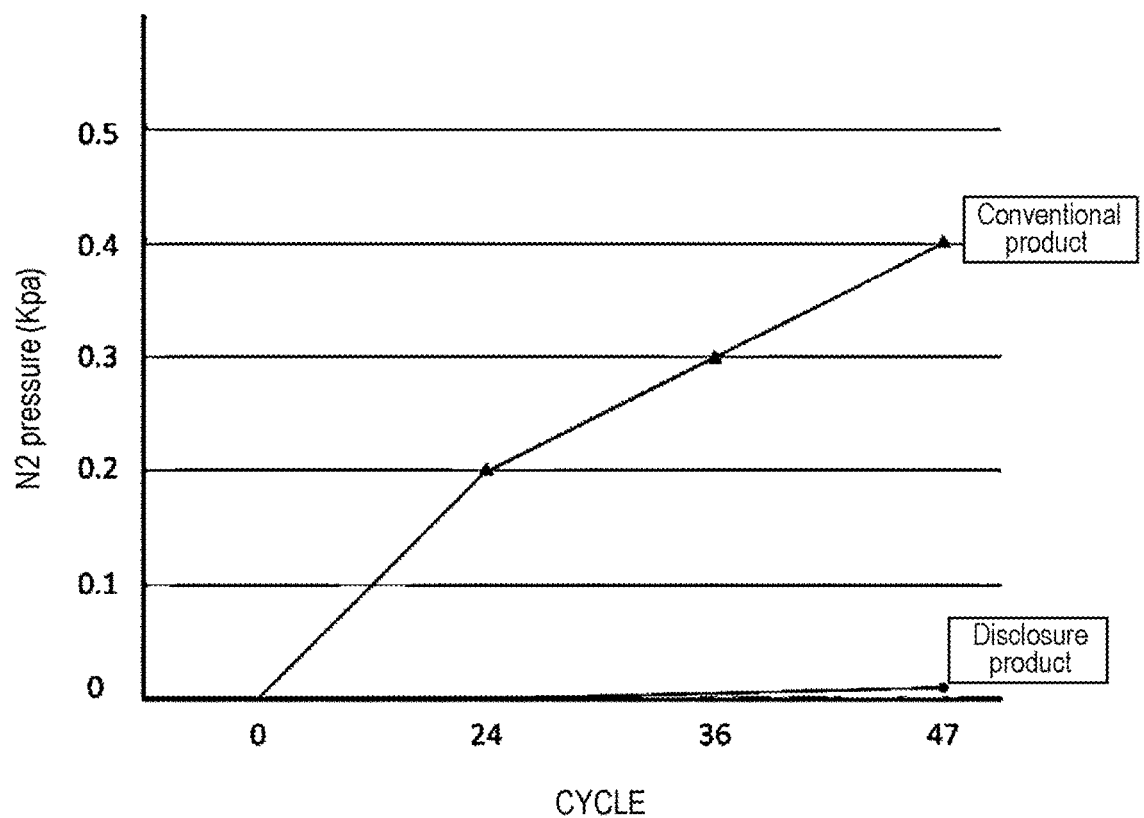

FIG. 17

| Component | Vaporizer A | Vaporizer B |
|---|---|---|
| Nozzle holder & nozzle (leading end) | Large amount of adhesion exists around injection port | Small amount of adhesion exists around injection port |
| Nozzle (cylindrical portion) | Adhesion exists around cylindrical portion of nozzle | Adhesion does not exist around cylindrical portion of nozzle |
| Nozzle plate cover | ——— (Not exist) | Small amount of adhesion exists in the vicinity |
| Residual amount (total) | Small | Very small |
| Pressure rise value | 6kpa(375Cycle) | 600Pa(320Cycle) |

SUBSTRATE PROCESSING APPARATUS, METHOD FOR MANUFACTURING SEMICONDUCTOR DEVICE AND VAPORIZER

CROSS-REFERENCE TO RELATED APPLICATION

This application is a Bypass Continuation Application of PCT international Application No. PCT/JP2016/059002 filed on Mar. 22, 2016, the entire contents of which are incorporated herein by reference.

TECHNICAL FIELD

The present disclosure relates to a substrate processing apparatus, a method for manufacturing semiconductor device and a vaporizer.

BACKGROUND

As a processing apparatus for processing a substrate, there is a substrate processing apparatus which has a processing furnace, accepts a predetermined number of substrates defined in the processing furnace, heats the substrates to a predetermined temperature, and supplies a processing gas into a process chamber to perform the substrate processing.

In the above-mentioned substrate processing apparatus, a liquid precursor is often used as a precursor of the processing gas, and the liquid precursor is atomized and then vaporized by a vaporizer to generate a vaporized gas (precursor gas) and the generated vaporized gas is supplied as the processing gas into the process chamber.

Conventionally, there is a vaporizer that vaporizes a liquid precursor by a bubbling method, a baking method, a direct vaporization method, or the like. In particular, in a depressurized field (high vacuum field) in which the interior of the vaporizer is depressurized, it was difficult to promote vaporization of the liquid precursor. According to Patent Document 1, a vaporization method is disclosed in which a liquid precursor is atomized and vaporized by radiant heat or the like. However, there is a case where a gas-liquid mixture injected at high speed from an upper portion of a vaporizer may reach an inner wall thereof and remain in the vaporizer to generate residue. Thus, to improve the vaporization efficiency in the vaporizer, a carrier gas is supplied by an inert gas to the gas-liquid mixture to promote the vaporization and to suppress the residue remaining within the vaporizer.

However, the vaporization method is selected based on various conditions such as the presence or absence of the carrier gas, the pressure range of the vaporizer side, or the precursor properties, but a versatile vaporizer that can have excellent vaporization efficiency and also reduce the residue has not been developed to date.

SUMMARY

Some embodiments of the present disclosure provide a structure capable of remarkably improving vaporization performance while reducing residue within a vaporizer.

According to one embodiment of the present disclosure, there is provided a structure, including: a vaporization chamber having a first portion and a second portion; a first fluid supply part connected to the first portion of the vaporization chamber, and configured to supply a mixed fluid in which a first carrier gas and a liquid precursor are mixed, toward the second portion; and a second fluid supply part configured to supply a second carrier gas toward the mixed fluid at the second portion.

BRIEF DESCRIPTION OF DRAWINGS

FIG. 12 is a graph illustrating pressure fluctuations in the second fluid supply part in the vaporizer according to the first embodiment of the present disclosure.

FIG. 17 is a diagram illustrating the results of verifying vaporization performance of the vaporizer according to the second embodiment of the present disclosure.

DETAILED DESCRIPTION

Figure 1:
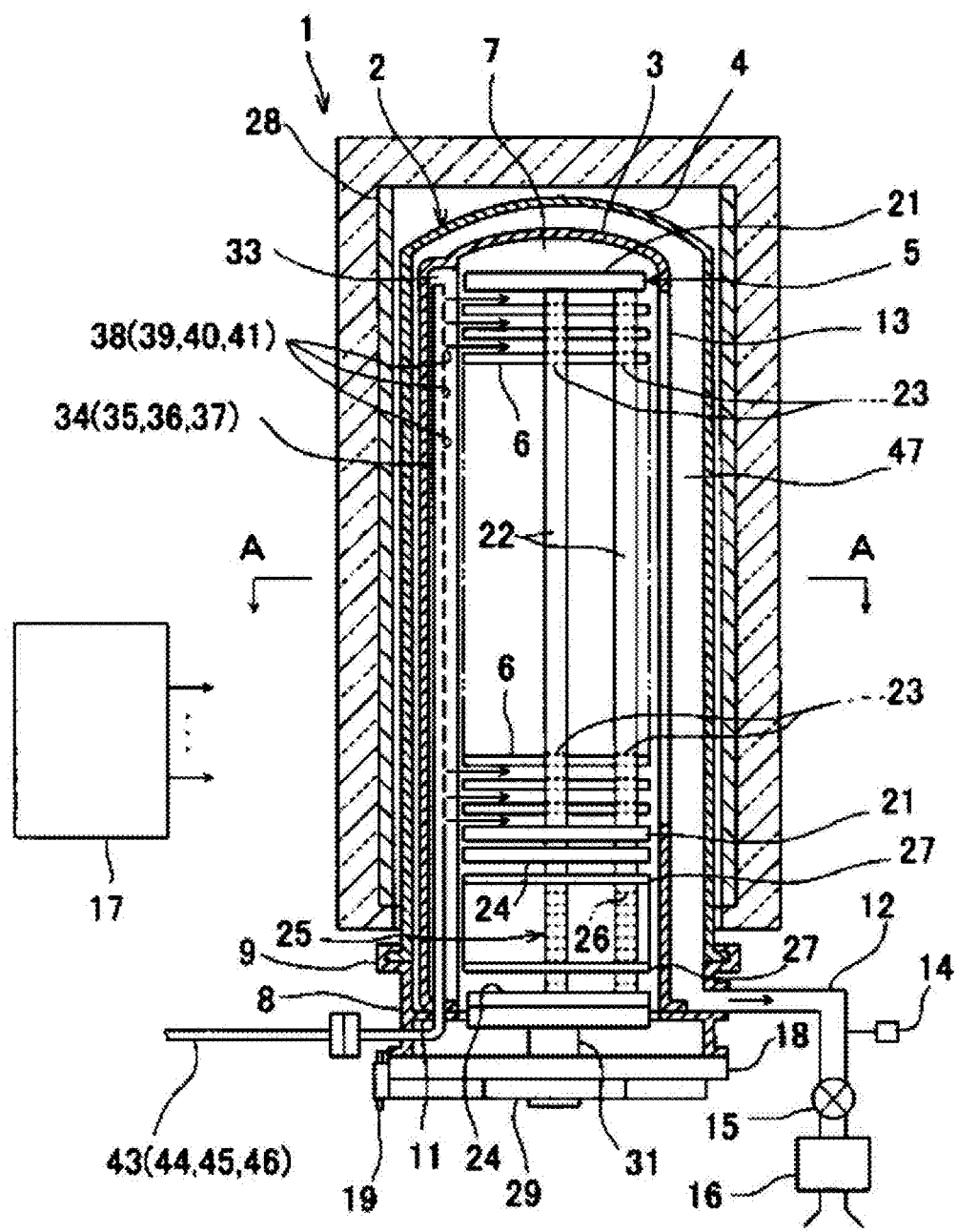
FIG. 1 is a vertical cross sectional view illustrating a processing furnace of a substrate processing apparatus suitably used in an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First, a substrate processing apparatus, which is an example of a semiconductor device used in one of the processes of manufacturing a semiconductor device, will be described.

Hereinafter, a case where a substrate processing apparatus which is a batch-type vertical apparatus that performs a film forming process or the like on a plurality of substrates at a time is used as an example of the substrate processing apparatus will be described.

Figure 2:
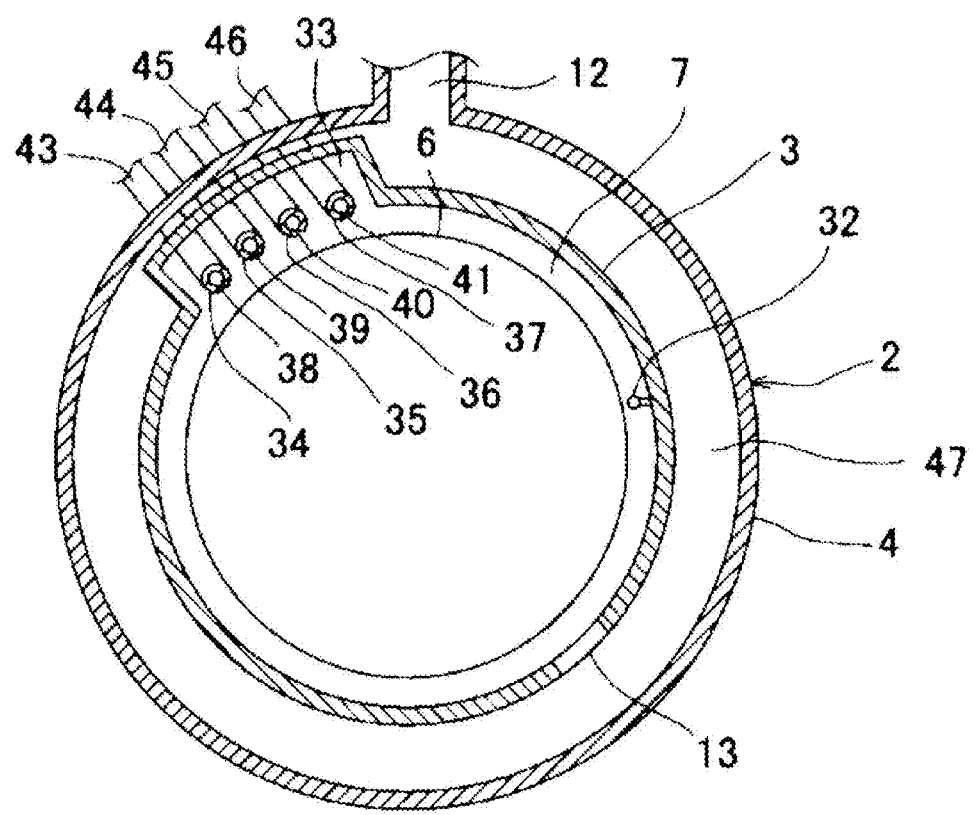
FIG. 2 is a view taken along line A-A in FIG. 1.

A processing furnace 1 of a substrate processing apparatus according to an embodiment of the present disclosure will be described with reference to FIGS. 1 and 2.

The processing furnace 1 has a vertical process tube 2 as a reaction tube which is vertically arranged so that the center line thereof is vertical and which is fixedly supported by a housing (not shown). The process tube 2 has an inner tube 3 and an outer tube 4. The inner tube 3 and the outer tube 4 are integrally molded with, for example, a material having high heat resistance such as quartz ($SiO_2$), silicon carbide (SiC), or a composite material of quartz and silicon carbide.

The inner tube 3 has a cylindrical shape with its upper end closed and its lower end opened, and a boat 5 serving as a substrate support means (substrate support) is accepted in the inner tube 3, wafers 6 as substrates are stacked in the boat 5 in a horizontal posture and in multiple stages and a process chamber 7 for accommodating and processing the wafers 6 is defined in the inner tube 3. A lower end opening of the inner tube 3 constitutes a furnace opening for inserting and removing the boat 5 supporting the wafers 6. Therefore, the inner diameter of the inner tube 3 is set to be larger than the maximum outer diameter of the boat 5 supporting the wafers 6.

The outer tube 4 has a cylindrical shape with its upper end closed and its lower end opened, and is concentrically arranged such that the inner diameter thereof is larger than the inner tube 3 and surrounds the outer side of the inner tube 3. A lower end portion of the outer tube 4 is attached to a flange 9 of a manifold 8 through an O-ring (not shown) and is hermetically sealed by the O-ring.

The lower end portion of the inner tube 3 is placed on a disk-shaped ring portion 11 formed on an inner peripheral surface of the manifold 8. The inner tube 3 and the outer tube 4 are detachably attached to the manifold 8 for maintenance work and cleaning work of the inner tube 3 and the outer tube 4. Furthermore, the manifold 8 is supported by the housing (not shown), so that the process tube 2 is vertically installed.

In the above description, the space defined inside the inner tube 3 is defined as the process chamber 7, but the space defined in the outer tube 4 may be referred to as the process chamber 7 hereinbelow.

An exhaust pipe 12 for exhausting the internal atmosphere of the process chamber 7 is connected to part of a sidewall of the manifold 8. An exhaust port for exhausting the internal atmosphere of the process chamber 7 is formed at a connection portion between the manifold 8 and the exhaust pipe 12. The inside of the exhaust pipe 12 communicates with an exhaust passage 47 (which will be described later) as a gap formed between the inner tube 3 and the outer tube 4 through the exhaust port. Furthermore, the cross sectional shape of the exhaust passage 47 is a substantially circular ring shape. Thus, it is possible to uniformly exhaust air from an upper end to a lower end of an exhaust hole 13 formed in the inner tube 3, which will be described later. That is, it is possible to uniformly exhaust air from all of the plurality of wafers 6 mounted on the boat 5.

A pressure sensor 14, an auto pressure controller (APC) valve 15 as a pressure regulator, and a vacuum pump 16 as a vacuum exhaust device are installed in the exhaust pipe 12 sequentially from its upstream side. The vacuum pump 16 is configured to vacuum-exhaust the interior of the process chamber 7 such that the internal pressure of the process chamber 7 becomes a predetermined pressure (degree of vacuum). A controller 17 is electrically connected to the pressure sensor 14 and the APC valve 15. The controller 17 is configured to control the opening degree of the APC valve 15 based on pressure detected by the pressure sensor 14 so that the internal pressure of the process chamber 7 becomes a desired pressure at a desired timing.

An exhaust unit (exhaust system) according to this embodiment is mainly configured by the exhaust pipe 12, the pressure sensor 14, and the APC valve 15. Also, the exhaust unit may include the vacuum pump 16. A trap device for supplementing the reaction byproduct or the unreacted precursor gas or the like in the exhaust gas, or an exclusion device for excluding the corrosive components or toxic components contained in the exhaust gas may also be connected to the exhaust pipe 12. In this case, the trap device or the exclusion device may be included in the exhaust unit.

A seal cap 18 for closing the lower end opening of the manifold 8 is brought into contact with the manifold 8 at a lower side in the vertical direction. The seal cap 18 has a disk shape having an outer diameter equal to or greater than the outer diameter of the outer tube 4, and is vertically moved up and down in a horizontal posture by a boat elevator 19 (which will be described later) vertically installed outside the process tube 2.

The boat 5 supporting the wafers 6 is vertically standing and supported on the seal cap 18. The boat 5 has a pair of upper and lower end plates 21 and a plurality of support members 22 vertically installed between the end plates 21. The end plates 21 and the support members 22 are made of, for example, a heat-resistant material such as quartz ($SiO_2$), silicon carbide (SiC), or a composite material of quartz and silicon carbide. A plurality of support grooves 23 are formed in the respective support members 22 at equal intervals in a longitudinal direction. The circumferential edges of the wafers 6 are inserted into the support grooves 23 of the same stage in the support members 22, respectively, such that the wafers 6 are stacked and supported in a horizontal posture and in multiple stages with the centers of the wafers 6 aligned with one another.

A pair of upper and lower auxiliary end plates 24 are supported by a plurality of auxiliary support members 25 between the boat 5 and the seal cap 18. A plurality of support grooves 26 are formed in the respective auxiliary support members 25. A plurality of disk-shaped heat insulating plates 27 made of a heat-resistant material such as, e.g., quartz ($SiO_2$) or silicon carbide (SiC) are stacked in the support grooves 26 in a horizontal posture and in multiple stages. Heat from a heater unit 28, which will be described later, is less likely to be transferred to the manifold 8 side by the heat insulating plates 27. Furthermore, it is possible to suppress the temperature drop on the lower side of the wafers 6 mounted on the boat 5.

A rotation mechanism 29 configured to rotate the boat 5 is installed at an opposite side of the seal cap 18 from the process chamber 7. A rotary shaft 31 of the rotation mechanism 29, which penetrates the seal cap 18, supports the boat 5 from below. By rotating the rotary shaft 31 by the rotation mechanism 29, the wafers 6 can be rotated in the process chamber 7.

Furthermore, the seal cap 18 is configured to be vertically moved up and down by a boat elevator 19 as a transfer means (transfer mechanism), and the boat 5 is configured to be transferred into and out of the process chamber 7 by the boat elevator 19.

A heater unit 28 as a heating means (heating mechanism) for heating the inside of the process tube 2 uniformly over the whole or in a predetermined temperature distribution is installed outside the outer tube 4 so as to surround the outer tube 4. The heater unit 28 is vertically installed by being supported by the housing (not shown) of the substrate processing apparatus, and is configured as, for example, a resistance heater such as a carbon heater.

A temperature sensor 32 as a temperature detector is installed inside the process tube 2. A heating unit (heating system) according to this embodiment is mainly configured by the heater unit 28 and the temperature sensor 32.

A channel-shaped preliminary chamber 33 is formed on the sidewall of the inner tube 3 (a position on a 180° opposite side of the exhaust hole 13 which will be described later) so as to protrude from the sidewall of the inner tube 3 in the radial direction of the inner tube 3 and extend longitudinally along the vertical direction. Furthermore, the inner wall of the preliminary chamber 33 forms part of the inner wall of the process chamber 7.

Nozzles 34, 35, 36, and 37 for supplying a gas into the process chamber 7 are installed in the preliminary chamber 33 such that they extend in a stacking direction of the wafers 6 from a lower portion to an upper portion of the preliminary chamber 33 so as to extend along the inner wall of the preliminary chamber 33 (namely the inner wall of the process chamber 7). That is, the nozzles 34, 35, 36, and 37 are installed at a lateral side of a wafer arrangement region in which the wafers 6 are arranged, namely in a region which horizontally surrounds the wafer arrangement region so as to extend along the wafer arrangement region.

The nozzles 34, 35, 36, and 37 are configured as L-shaped long nozzles. Horizontal portions of the nozzles 34, 35, 36, and 37 are installed to penetrate the manifold 8, and vertical portions of the nozzles 34, 35, 36, and 37 are installed to extend upward from a lower end to an upper end of the wafer arrangement region. For the sake of convenience, only one nozzle 34 is illustrated in FIG. 1, but the four nozzles 34, 35, 36, and 37 are actually installed as illustrated in FIG. 2.

A plurality of gas supply holes 38, 39, 40 and 41 for supplying a gas are installed on the side surfaces of the nozzles 34, 35, 36, and 37, respectively. Each of the gas supply holes 38, 39, 40, and 41 is formed to have an aperture area having the same or inclined size from a lower portion to an upper portion thereof, and is also formed to have the same aperture pitch.

End portions of the horizontal portions of the nozzles 34, 35, 36, and 37, which penetrate the manifold 8, are respectively connected to gas supply pipes 43, 44, 45, and 46 as gas supply lines outside the process tube 2.

As described above, in a gas supply method according to this embodiment, the gas is transferred through the nozzles 34, 35, 36, and 37 arranged in the preliminary chamber 33, and is injected from the gas supply holes 38, 39, 40, and 41 into the process chamber 7 around the wafers 6.

The exhaust hole 13, which is for example a slit-shaped through hole, is formed to be vertically elongated on the sidewall of the inner tube 3 at a position opposing the nozzles 34, 35, 36, and 37, namely at a position on a 180° opposite side of the preliminary chamber 33. An exhaust passage 47 is formed by a gap between the inner tube 3 and the outer tube 4, and the exhaust passage 47 communicates with the process chamber 7 through the exhaust hole 13. Therefore, the gas supplied from the gas supply holes 38, 39, 40, and 41 into the process chamber 7 flows into the exhaust passage 47 through the exhaust hole 13, flows into the exhaust pipe 12 through the exhaust port, and is discharged to the outside of the process chamber 7.

At this time, the gas supplied from the gas supply holes 38, 39, 40, and 41 to the vicinity of the wafers 6 in the process chamber 7 flows in the horizontal direction, namely in a direction parallel to the surfaces of the wafers 6, and then flows to the exhaust passage 47 through the exhaust hole 13. That is, the gas in the process chamber 7 mainly flows in the horizontal direction, namely the direction parallel to the surfaces of the wafers 6. With this configuration, the gas can be uniformly supplied to each wafer 6, thus making the thickness of a thin film formed on each wafer 6 uniform. Furthermore, the exhaust hole 13 is not limited to the slit-shaped through hole but may be formed by a plurality of holes.

Figure 3:
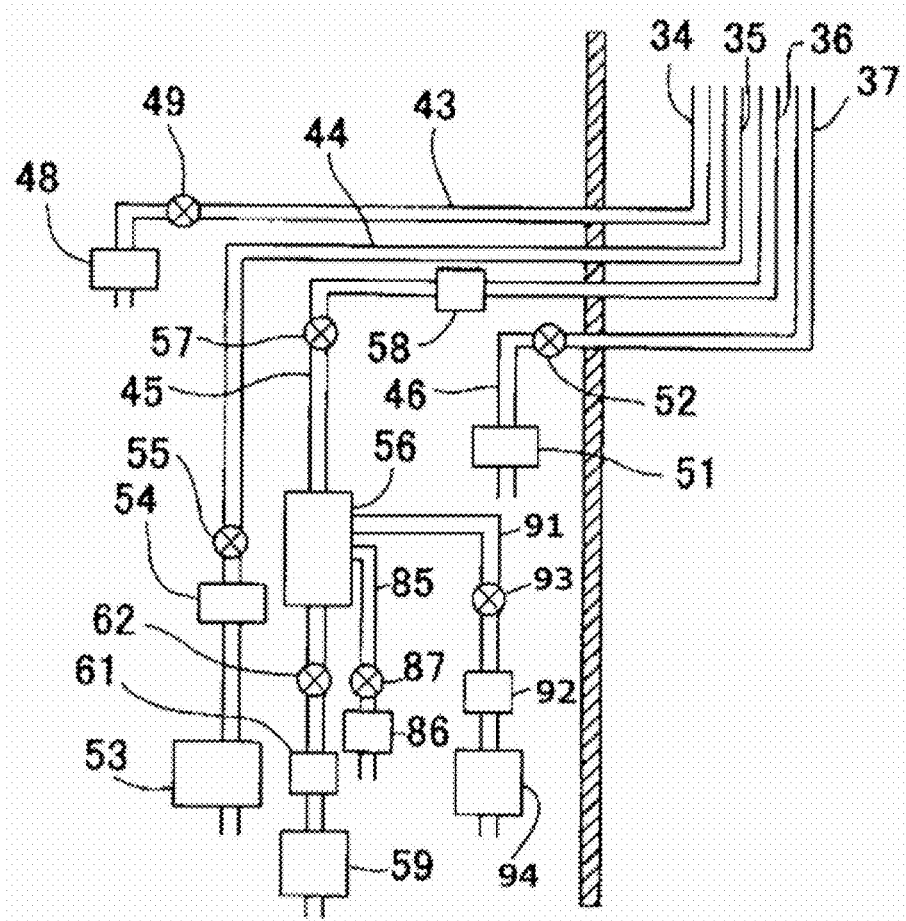
FIG. 3 is a schematic configuration diagram illustrating a gas supply system of the substrate processing apparatus suitably used in an embodiment of the present disclosure.

Next, a gas supply system according to this embodiment will be described with reference to FIG. 3.

A mass flow controller (MFC) 48 which is a flow rate control device (flow rate control part), and a valve 49 which is an opening/closing valve are respectively installed in the gas supply pipe 43 sequentially from its upstream side, and for example, a nitrogen ($N_2$) gas as an inert gas is supplied to the process chamber 7 through the gas supply pipe 43 and the nozzle 34. A first inert gas supply system is mainly configured by the nozzle 34, the gas supply pipe 43, the MFC 48, and the valve 49.

A mass flow controller (MFC) 51 which is a flow rate control device (flow rate control part) 51 and a valve 52 which is an opening/closing valve are respectively installed in the gas supply pipe 46 sequentially from its upstream side, and for example, a nitrogen ($N_2$) gas as an inert gas is supplied to the process chamber 7 through the gas supply pipe 46 and the nozzle 37. A second inert gas supply system is mainly configured by the nozzle 37, the gas supply pipe 46, the MFC 51, and the valve 52.

An inert gas supply system is constituted by either or both of the first inert gas supply system and the second inert gas supply system. The two supply systems may be used separately according to the processing on the wafers 6, but the uniform processing may be performed on the wafers 6 by using both the first inert gas supply system and the second inert gas supply system. Furthermore, as illustrated in FIG. 2, it is desirable that the nozzle 34 and the nozzle 37 be arranged with other nozzles interposed therebetween. With this arrangement, it is possible to improve the processing uniformity of the wafers 6.

An ozonizer 53 as a reaction gas activation device, an MFC 54 as a flow rate control device (flow rate control part), and a valve 55 as an opening/closing valve are installed in the gas supply pipe 44 sequentially from its upstream side. A nozzle 35 is connected to a leading end of the gas supply pipe 44.

The upstream side of the gas supply pipe 44 is connected to an oxygen gas supply source (not shown) for supplying an oxygen ($O_2$) gas as an oxidizing gas. The $O_2$ gas supplied to the ozonizer 53 is activated by the ozonizer 53 to become an ozone ($O_3$) gas as an oxidizing gas which is a reaction gas, and supplied into the process chamber 7. A reaction gas supply system is mainly configured by the nozzle 35, the gas supply pipe 44, the ozonizer 53, the MFC 54, and the valve 55.

A vaporizer 56 which is a vaporization system (vaporization part) and which vaporizes a liquid precursor to generate a vaporized gas as a precursor gas is installed in the gas supply pipe 45, and a valve 57 as an opening/closing valve and a gas filter 58 are installed, at the downstream side of the vaporizer 56, sequentially from an upstream side of the gas supply pipe 45. A nozzle 36 is connected to a leading end of the gas supply pipe 45. By opening the valve 57, the vaporized gas generated in the vaporizer 56 is supplied into the process chamber 7 through the nozzle 36. A precursor gas supply system (vaporized gas supply system) is mainly configured by the nozzle 36, the gas supply pipe 45, the vaporizer 56, the valve 57, and the gas filter 58. A carrier gas supply system and a liquid precursor supply system, which will be described later, may also be included in the precursor gas supply system.

A liquid precursor tank 59, a liquid flow rate control device (LMFC) 61, and a valve 62 as an opening/closing valve are installed, at the upstream side of the vaporizer 56 of the gas supply pipe 45, sequentially from the upstream side of the gas supply pipe 45. The supply amount of the liquid precursor into the vaporizer 56, namely the supply flow rate of the vaporized gas which is vaporized in the vaporizer 56 and supplied into the process chamber 7, is controlled by the LMFC 61. A liquid precursor supply system is mainly configured by the gas supply pipe 45, the liquid precursor tank 59, the LMFC 61, and the valve 62.

In addition, an inert gas as a first carrier gas is supplied from a gas supply pipe 85 to the vaporizer 56, and an inert gas as a second carrier gas is supplied from a gas supply pipe 91 to the vaporizer 56. An MFC 86 and a valve 87 are installed in the gas supply pipe 85 sequentially from its upstream side. By diluting the vaporized gas generated by the vaporizer 56 with the carrier gas, it is possible to adjust the film thickness uniformity between the wafers 6 mounted on the boat 5 and the processing uniformity of the wafers 6 between the wafers 6. A first carrier gas supply system is mainly configured by the gas supply pipe 85, the MFC 86, and the valve 87, and a second carrier gas supply system is mainly configured by the gas supply pipe 91, the MFC 92, the valve 93, and a heating mechanism 94.

A precursor gas as a metal-containing gas, for example, a zirconium precursor gas, i.e., a gas containing zirconium (Zr) (zirconium (Zr)-containing gas), is supplied as a precursor gas from the gas supply pipe 45 into the process chamber 7 via the LMFC 61, the vaporizer 56, the gas filter 58, the nozzle 36, and the like. As the zirconium-containing gas, it may be possible to use, for example, tetrakisethylmethylamino zirconium (TEMAZ, $Zr[N(CH_3)C_2H_5]_4$). TEMAZ is a liquid under room temperature and atmospheric pressure, and the liquid TEMAZ is stored as a liquid precursor in the liquid precursor tank 59.

Details of the vaporizer 56 will be described later.

Figure 7:
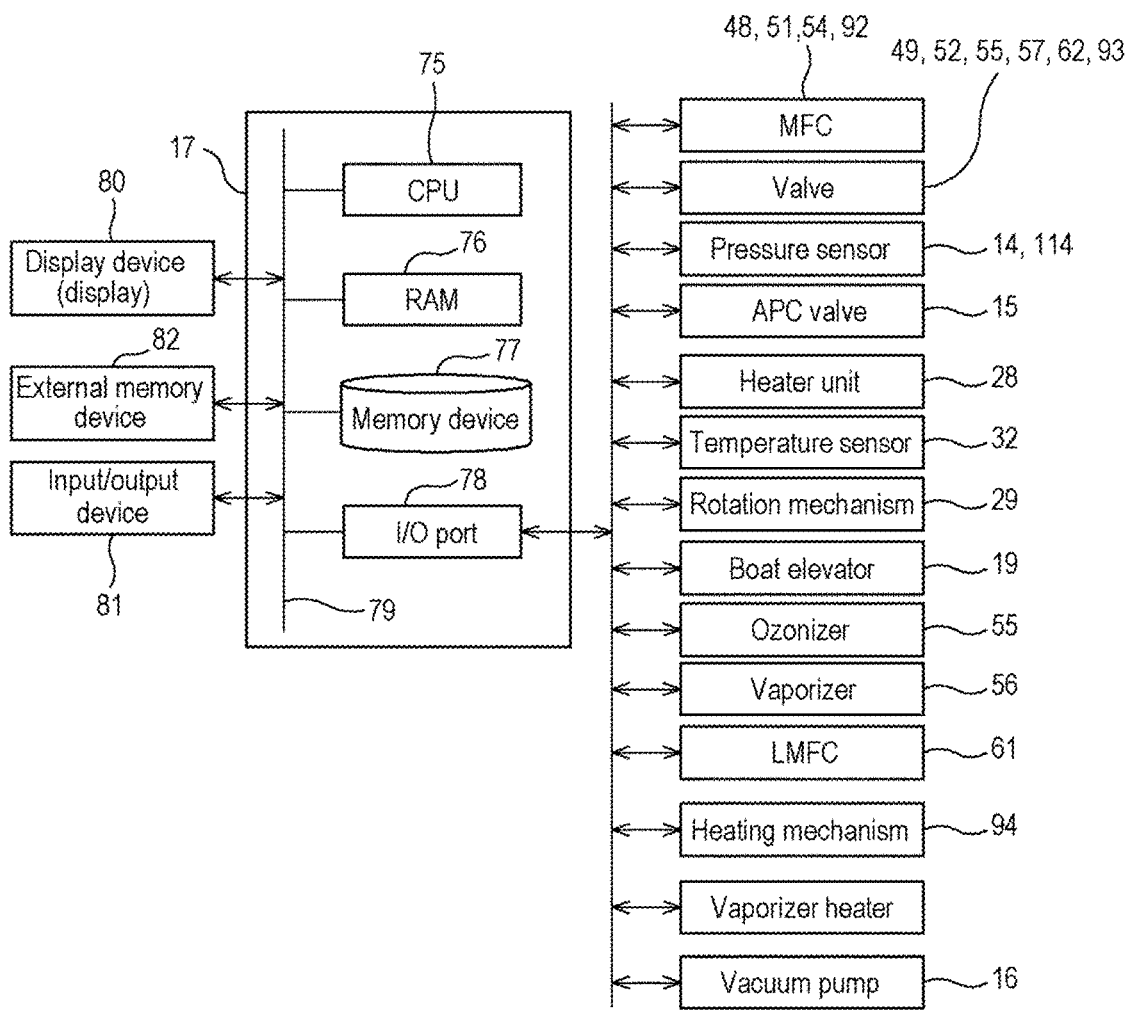
FIG. 7 is a schematic configuration diagram illustrating a control system of the substrate processing apparatus suitably used in an embodiment of the present disclosure.

Next, the connection between the controller 17 as a control part (control means) and each component will be described with reference to FIG. 7.

The controller 17 is configured as a computer including a central processing unit (CPU) 75, a random access memory (RAM) 76, a memory device 77, and an I/O port 78. The RAM 76, the memory device 77, and the I/O port 78 are configured to exchange data with the CPU 75 via an internal bus 79. A display device 80 such as a display, or an input/output device 81 formed of, e.g., a touch panel or the like, is connected to the controller 17.

The memory device 77 is configured by, for example, a flash memory, a hard disk drive (HDD), or the like. A control program for controlling operations of a substrate processing apparatus, a process recipe for specifying sequences and conditions of a substrate process as described hereinbelow, or the like is readably stored in the memory device 77. The process recipe functions as a program for causing the controller 17 to execute each sequence in a substrate processing process, as described hereinbelow, to obtain a predetermined result. Hereinafter, the process recipe and the control program will be generally and simply referred to as a "program." Furthermore, when the term "program" is used herein, it may indicate a case of including only the process recipe, a case of including only the control program, or a case of including both the process recipe and the control program. The RAM 76 is configured as a memory area (work area) in which a program or data read by the CPU 75 is temporarily stored.

The I/O port 78 is connected to the MFCs 48, 51, 54 and 92, the valves 49, 52, 55, 57, 62 and 93, the pressure sensors 14 and 114, the APC valve 15, the vacuum pump 16, the boat elevator 19, the heater unit 28, the rotation mechanism 29, the temperature sensor 32, the ozonizer 53, the vaporizer 56, the LMFC 61, the heating mechanism 94, and the like.

The CPU 75 is configured to read the control program from the memory device 77 and execute the same. The CPU 75 also reads the process recipe from the memory device 77 according to an input of an operation command from the input/output device 81. In addition, the CPU 75 is configured to control, according to the contents of the process recipe thus read, the flow rate adjusting operation of various kinds of gases by the MFCs 48, 51 and 54, the flow rate of the liquid precursor by the LMFC 61, the opening/closing operation of the valves 49, 52, 55, 57 and 62, the opening/closing operation of the APC valve 15, the pressure regulating operation performed by the APC valve 15 based on the pressure sensor 14, the temperature adjusting operation performed by the heater unit 28 based on the temperature sensor 32, the driving and stopping operation of the vacuum pump 16, the operation of rotating the boat 5 with the rotation mechanism 29 and adjusting the rotation speed of the boat 5, the operation of moving the boat 5 up and down with the boat elevator 19, the heating adjustment operation of the second carrier gas (inert gas) by the heating mechanism 94, and the like.

The controller 17 is not limited to a case of being configured as a dedicated computer but may be configured as a general-purpose computer. For example, the controller 17 may be configured by installing, on the general-purpose computer, the aforementioned program stored in an external memory device 82 (for example, a magnetic tape, a magnetic disk such as a flexible disk or a hard disc, an optical disc such as a CD or DVD, a magneto-optical disc such as an MO, a semiconductor memory such as a USB memory (USB flash drive) or a memory card). Furthermore, means for supplying the program to the computer is not limited to a case of being supplied to the computer via the external memory device 82. For example, the program may be supplied to the computer using a communication means such as the Internet or a dedicated line, instead of using the external memory device 82. The memory device 77 or the external memory device 82 is configured as a non-transitory computer-readable recording medium. Hereinafter, the memory device 77 and the external memory device 82 will be generally and simply referred to as a "recording medium." When the phrase "recording medium" is used herein, it may indicate a case of including only the memory device 77, a case of including only the external memory device 82 or a case of including both the memory device 77 and the external memory device 82.

Figure 8:
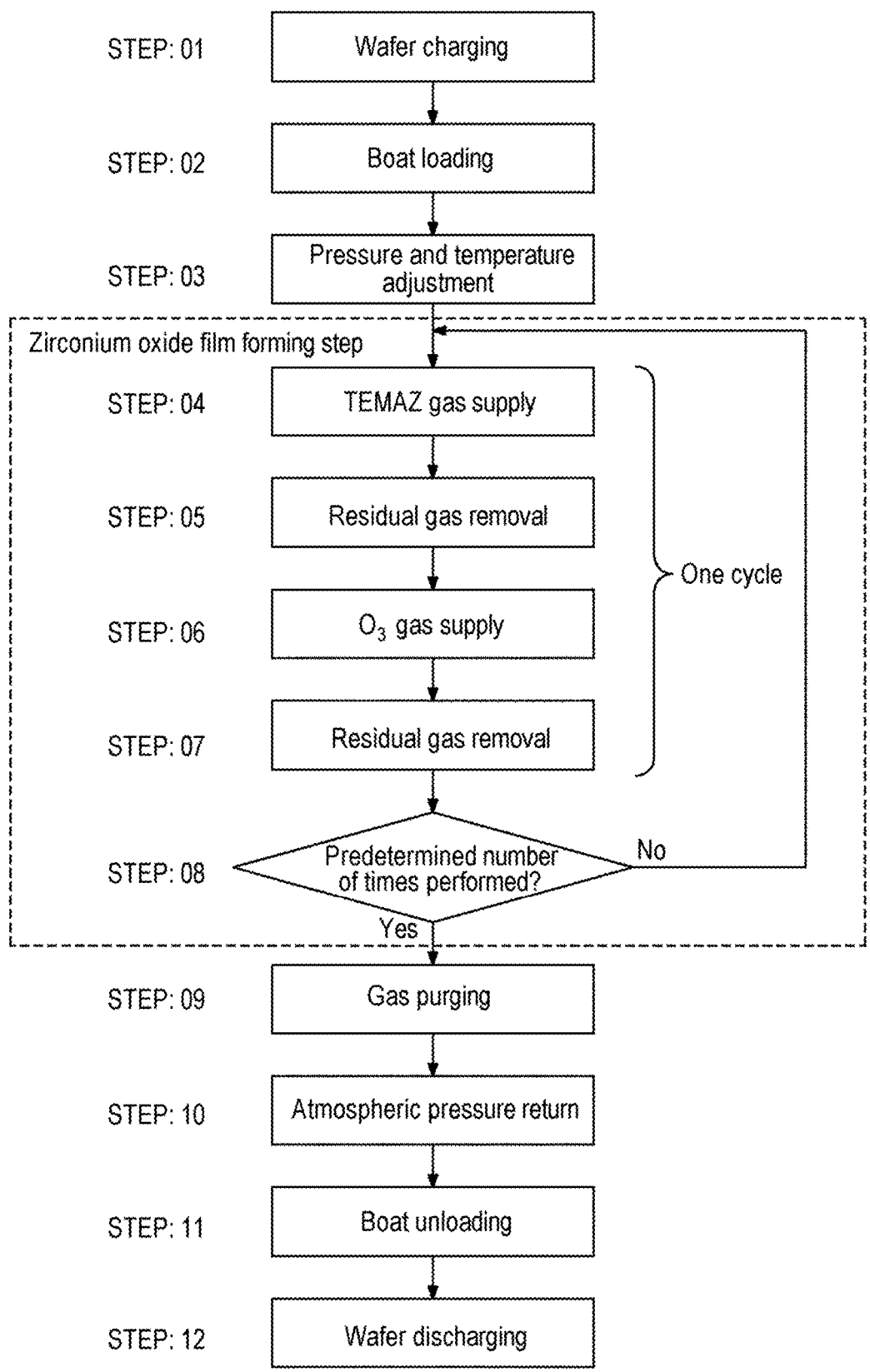
FIG. 8 is a flowchart illustrating a process for forming a zirconium oxide film on a substrate by the substrate processing apparatus suitably used in an embodiment of the present disclosure.

Next, a sequence example of forming an insulating film, for example, a zirconium oxide film ($ZrO_2$, hereinafter also referred to as ZrO) as a metal oxide film which is a high-dielectric-constant (high-k) film, on a substrate using the processing furnace 1 of the aforementioned substrate processing apparatus, which is one of the processes for manufacturing a semiconductor device, will be described with reference to FIG. 8. In the following descriptions, the operations of the respective parts constituting the substrate processing apparatus are controlled by the controller 17.

When the term "wafer" is used herein, it may refer to "a wafer itself" or "a laminated body (aggregate) of a wafer and a predetermined layer or film formed on the surface of the wafer." That is, a wafer, including a predetermined layer or film formed on the surface of the wafer, may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer." In this case, in the above description, the term "wafer" may be replaced with "substrate."

Hereinafter, the substrate processing process will be described.

STEP: 01: First, a plurality of wafers 6 are charged on the boat 5 (wafer charging).

STEP: 02: Subsequently, the boat 5 is lifted up by the boat elevator 19 and is loaded into the process chamber 7 (boat loading). In this state, the seal cap 18 seals the lower end of the manifold 8.

STEP: 03: After the boat 5 is loaded, the interior of the process chamber 7 is vacuum-exhausted by the vacuum pump 16 so as to reach a desired pressure (degree of vacuum). In this operation, the internal pressure of the process chamber 7 is measured by the pressure sensor 14. The APC valve 15 is feedback-controlled based on the measured pressure (pressure regulation). The interior of the process chamber 7 is heated by the heater unit 28 to a desired temperature. In this operation, the state of supplying electric power to the heater unit 28 is feedback-controlled based on the temperature information detected by the temperature sensor 32 such that the interior of the process chamber 7 has a desired temperature distribution (temperature adjustment). Subsequently, the boat 5 is rotated by the rotation mechanism 29 so that the wafers 6 are rotated.

Furthermore, the operation of the vacuum pump 16, the heating of the interior of the process chamber 7 by the heater unit 28, and the rotation of the boat 5 and the wafers 6 by the rotation mechanism 29 may be continuously performed at least until the processing of the wafers 6 is completed.

Next, a zirconium oxide film forming step of forming a ZrO film by supplying a TEMAZ gas and an $O_3$ gas into the process chamber 7 is performed. At the zirconium oxide film forming step, four steps of STEP: 04 to STEP: 08 are sequentially executed.

STEP: 04: First, the valve 57 of the gas supply pipe 45 is opened to allow a TEMAZ gas to flow through the gas supply pipe 45 via the vaporizer 56 and the gas filter 58. The flow rate of the TEMAZ gas flowing through the gas supply pipe 45 is adjusted by the LMFC 61. The TEMAZ gas, which is vaporized by the vaporizer 56, is supplied from the gas supply hole 40 of the nozzle 36 into the process chamber 7 and is exhausted from the exhaust pipe 12.

Furthermore, in parallel with the supply of the TEMAZ gas, the valve 49 is opened to allow an inert gas such as $N_2$ to flow from the gas supply pipe 43, the nozzle 34 and the gas supply hole 38, and the valve 52 is opened to allow an inert gas such as $N_2$ to flow from the gas supply pipe 46, the nozzle 37, and the gas supply hole 41.

At this time, the internal pressure of the process chamber 7 may be set at a pressure which falls within a range of, for example, 100 to 500 Pa, by appropriately adjusting the opening degree of the APC valve 15. The supply flow rate of the TEMAZ gas controlled by the LMFC 61 may be set at a flow rate which falls within a range of, for example, 0.045 to 5.0 g/min, and may be 2.0 g/min in this embodiment. Furthermore, the time period, during which the wafer 6 is exposed to the TEMAZ gas, namely the gas supply time period (the irradiation time period), may be set at a time period which falls within a range of, for example, 10 to 300 seconds. The temperature of the heater unit 28 at this time is set such that the temperature of the wafer 6 becomes a temperature which falls within a range of, for example, 150 to 300 degrees C. A Zr (zirconium)-containing layer is formed on the wafer 6 by the supply of the TEMAZ gas.

STEP: 05: After the TEMAZ gas is supplied, the valve 57 is closed to stop the supply of the TEMAZ gas into the process chamber 7. At this time, the interior of the process chamber 7 is vacuum-exhausted by the vacuum pump 16 while opening the APC valve 15 of the exhaust pipe 12, and the unreacted TEMAZ gas or the TEMAZ gas contributed to the formation of the Zr-containing layer, which remains within the process chamber 7, is exhausted from the interior of the process chamber 7.

At this time, the supply of the $N_2$ gas as the inert gas into the process chamber 7 is maintained while opening the valves 49 and 52. The $N_2$ gas acts as a purge gas. This makes it possible to further enhance the effect of exhausting the unreacted TEMAZ gas or the TEMAZ gas contributed to the formation of the Zr-containing layer, which remains within the process chamber 7, from the interior of the process chamber 7.

The gas remaining within the process chamber 7 may not be completely removed and the interior of the process chamber 7 may not be completely purged. If the amount of the gas remaining within the process chamber 7 is small, an adverse effect may not be generated at STEP: 06 which will be performed later. In this case, it is not necessary to make the flow rate of the $N_2$ gas supplied into the process chamber 7 large. For example, by supplying the $N_2$ gas substantially in the same amount as the volume of the outer tube 4 (or the process chamber 7), it is possible to perform a purge operation such that an adverse effect is not generated at STEP: 06. By not completely purging the interior of the process chamber 7 in this way, it is possible to shorten the purge time and to improve the throughput. In addition, it is possible to suppress the consumption of the N₂ gas to a necessary minimum level.

STEP: 06: After the gas remaining within the process chamber 7 is removed, the valve 55 of the gas supply pipe 44 is opened and the flow rate of the O₃ gas generated by the ozonizer 53 is adjusted by the MFC 54. The O₃ gas is supplied from the gas supply hole 39 of the nozzle 35 into the process chamber 7 and is discharged from the exhaust pipe 12. Furthermore, in parallel with the supply of the O₃ gas, the valve 49 is opened to allow an inert gas such as N₂ to flow from the gas supply pipe 43, the nozzle 34 and the gas supply hole 38, and the valve 52 is opened to allow an inert gas such as N₂ to flow from the gas supply pipe 46, the nozzle 37, and the gas supply hole 41.

When the O₃ gas is supplied, the internal pressure of the process chamber 7 may be set at a pressure which falls within a range of, for example, 100 to 500 Pa, by appropriately adjusting the opening degree of the APC valve 15. The supply flow rate of the O₃ gas controlled by the MFC 54 may be set at a flow rate which falls within a range of, for example, 10 to 90 SLM. Furthermore, the time period, during which the wafer 6 is exposed to the O₃ gas, namely the gas supply time period (the irradiation time period), may be set at a time period which falls within a range of, for example, 10 to 300 seconds. Similar to STEP: 04, the temperature of the heater unit 28 is set such that the temperature of the wafer 6 becomes a temperature which falls within a range of 150 to 300 degrees C. The Zr-containing layer formed on the wafer 6 at STEP: 04 is oxidized by the supply of the O₃ gas to form a ZrO layer.

STEP: 07: After the ZrO layer is formed, the valve 55 is closed to stop the supply of the O₃ gas into the process chamber 7. At this time, the interior of the process chamber 7 is vacuum-exhausted by the vacuum pump 16 while opening the APC valve 15 of the exhaust pipe 12. The unreacted O₃ gas or the O₃ gas contributed to the oxidation, which remains within the process chamber 7, is exhausted from the interior of the process chamber 7.

At this time, the supply of the N₂ gas as the inert gas into the process chamber 7 is maintained while opening the valves 49 and 52. The N₂ gas acts as a purge gas. This makes it possible to further enhance the effect of exhausting the unreacted O₃ gas or the O₃ gas contributed to the formation of the ZrO layer, which remains within the process chamber 7, from the interior of the process chamber 7.

The gas remaining within the process chamber 7 may not be completely removed and the interior of the process chamber 7 may not be completely purged. If the amount of the gas remaining within the process chamber 7 is small, an adverse effect may not be generated in the case of performing STEP: 04 again. In this case, it is not necessary to make the flow rate of the N₂ gas supplied into the process chamber 7 large. For example, by supplying the N₂ gas substantially in the same amount as the volume of the outer tube 4 (or the process chamber 7), it is possible to perform a purge operation such that an adverse effect is not generated at STEP: 04. By not completely purging the interior of the process chamber 7 in this way, it is possible to shorten the purge time and to improve the throughput. In addition, it is possible to suppress the consumption of the N₂ gas to a necessary minimum level.

STEP: 08: STEP: 04 to STEP: 07 described above are set as one cycle and it is determined whether this cycle is implemented a predetermined number of times. By implementing this cycle at least once, a high-dielectric-constant film, i.e., a ZrO film, having a predetermined film thickness and containing zirconium and oxygen, can be formed on the wafer 6. The aforementioned cycle may be repeated multiple times. By implementing this cycle multiple times, a ZrO film having a predetermined film thickness can be formed on the wafer 6.

STEP: 09: After the ZrO film is formed, the valves 49 and 52 are opened to allow the N₂ gas to flow through the process chamber 7. The N₂ gas acts as a purge gas. Thus, the interior of the process chamber 7 is purged with an inert gas, and the gas, which remains with the process chamber 7, is removed from the interior of the process chamber 7.

STEP: 10: After the internal atmosphere of the process chamber 7 is substituted by an inert gas, the internal pressure of the process chamber 7 is returned to an atmospheric pressure (normal pressure) (atmospheric pressure return).

STEP: 11: Thereafter, the seal cap 18 is moved down by the boat elevator 19 to open the lower end of the manifold 8. The processed wafers 6 supported on the boat 5 are unloaded from the lower end of the manifold 8 to the outside of the process tube 2 (boat unloading).

STEP: 12: Finally, the processed wafers 6 are discharged from the boat 5 (wafer discharging) and the substrate processing is completed.

First Embodiment

Next, details of the vaporizer 56 according to an embodiment of the present disclosure will be described with reference to FIGS. 4 to 6.

Figure 4:
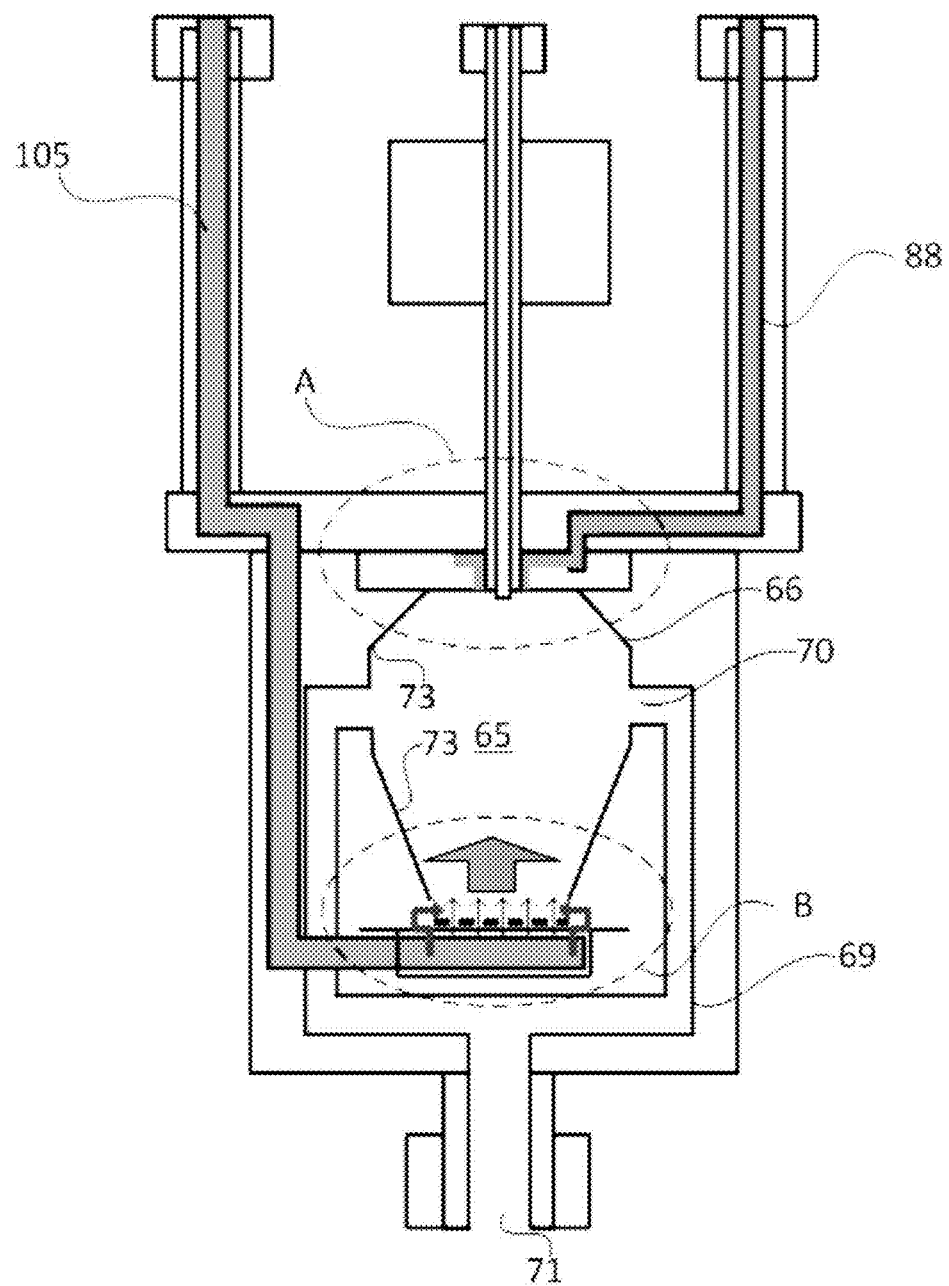
FIG. 4 is a schematic vertical cross sectional view illustrating a vaporizer suitably used in an embodiment of the present disclosure.

As illustrated in FIG. 4, the vaporizer 56 as a vaporization system includes at least a vaporization tube 66 constituting a vaporization chamber 65 and a delivery part 69, a first fluid supply part for supplying a mixed fluid obtained by mixing a first carrier gas (inert gas) 88 and a liquid precursor 63 to the vaporization chamber 65, and a second fluid supply part for supplying a second carrier gas (inert gas) 105 to the vaporization chamber 65 toward the mixed fluid. The second fluid supply part is installed on one end side of the vaporization chamber 65, and the first fluid supply part is installed on the other end side of the second fluid supply part.

The vaporization chamber 65 is constituted by the vaporization tube 66, and tapered portions are installed on an inner wall of the vaporization chamber 65 at an upper side and a lower side of the vaporization chamber 65 so as to suppress stagnation or turbulent flow of the supplied gas, and a discharge hole 70 is formed at the center of the vaporization chamber 65. The delivery part 69 is a part for forming a flow passage of the vaporized gas, in which a plurality of discharge holes 70 correspond to its inlet, and a delivery hole 71 corresponds to its outlet. Then, the vaporized gas (precursor gas) is supplied from the delivery hole 71 to the process chamber 7.

The first fluid supply part A is arranged in an upper portion of the vaporization chamber 65, and the second fluid supply part B is arranged in a lower portion of the vaporization chamber. Each of the first fluid supply part and the second fluid supply part has a gas injection hole. Thus, the vaporizer 56 has gas injection holes respectively on upper and lower opposing surfaces of the vaporization chamber 65. One is for the mixed fluid as an atomizing mist (hereinafter, simply referred to as a mist) in which the liquid precursor and the first carrier gas 88 are mixed, and the other one is for the second carrier gas 105 which is an inert gas (hereinafter, referred to as a Hot-N2 gas) having a thermal energy necessary for vaporizing this mist and has a structure in which these mist and second carrier gas 105 collide with each other in the vaporization tube 66. It is needless to say that not only the vertical direction but also other directions are possible.

In addition, tapered portions 73 are installed on the inner wall of the vaporization chamber 65 at an upper side and a lower side of the vaporization chamber 65 so as to suppress stagnation or turbulent flow of the supplied gas, and a plurality of discharge holes 70 are formed at the center of the vaporization chamber 65. Specifically, taper processing is performed from the first fluid supply part and the second fluid supply part to the vicinity of the discharge holes 70 to secure a flow passage of the mixed fluid and the second carrier gas 105. This makes it possible to reduce the stagnation region within the vaporization tube 66. In addition, a heater (not shown) is installed in the vaporization tube 66 so that the temperature of the wall surface thereof is adjusted by the heater. Thus, the heat transfer efficiency from the wall surface of the vaporization tube 66 is improved and the mist adhered to the wall surface is efficiently vaporized, thereby reducing residue on the wall surface of the vaporization tube 66.

Furthermore, the vaporized gas (precursor gas) vaporized in the vaporization chamber 65 is collected in one pipe by the delivery hole 71 through the discharge holes 70, and then supplied to the process chamber 7. The vaporized gas flowing from the discharge holes 70 is mixed and the distance from the mixing portion to the delivery hole 71 is set to a predetermined length so that the flow direction of the mixed vaporized gas becomes constant.

When there is stagnation of the mist within the vaporization tube 66, residue adheres to the wall surface of the vaporization tube 66, and when the adhesion amount increases, the flow of the gas to the discharge holes 70 may be disturbed to generate turbulent flow. The generation of the residue and turbulent flow of the mixed fluid causes a hindrance to the stable supply of the flow rate of the vaporized gas (precursor gas), but according to this embodiment, the instability of the precursor supply is greatly reduced.

Furthermore, as illustrated in FIG. 4, the number of the discharge holes 70 installed on the sidewall of the vaporization chamber 65 in this embodiment is two. However, the present disclosure is not limited to this embodiment, but three or more may be formed, and a plurality of discharge holes may be formed equally (e.g., at an equal interval) in the circumferential direction on the sidewall of the vaporization chamber 65.

Figure 6:
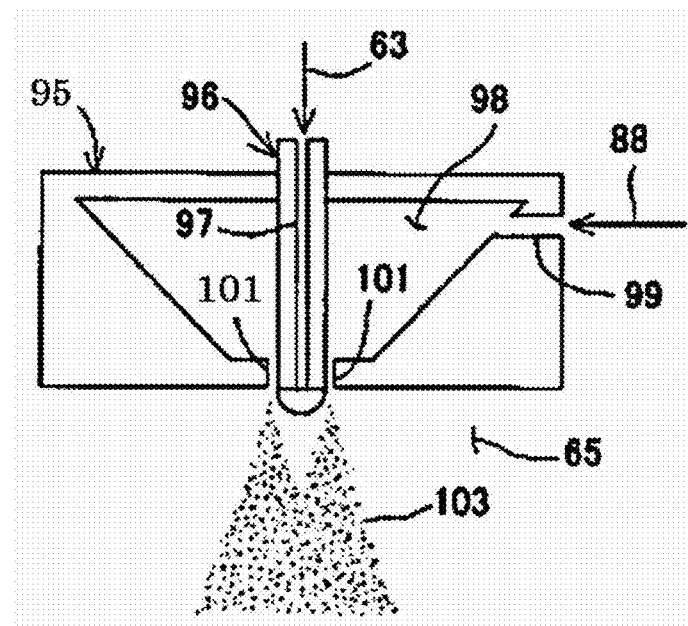
FIG. 6 is a diagram illustrating an example of a first fluid supply part of a vaporizer suitably used in a first embodiment of the present disclosure.

As illustrated in FIG. 6, the first fluid supply part is configured to include at least a nozzle holder 95 as the other end portion, a nozzle 96 for supplying the liquid precursor 63, and a carrier gas chamber 98.

A two-fluid spray type spray nozzle 96 for atomizing the liquid precursor 63 is installed in the nozzle holder 95 as a spray nozzle for spraying (atomizing) the liquid precursor 63 in the vaporization chamber 65.

The spray nozzle 96 has a cylindrical shape, and a spray flow passage 97 to which the liquid precursor 63 is supplied from the gas supply pipe 45 (see FIG. 3) is formed inside the spray nozzle 96.

In the vaporizer 56, the carrier gas chamber 98 having a predetermined volume and also having, for example, an inverted truncated cone shape, is formed so as to surround the spray nozzle 96, and the spray nozzle 96 is configured to vertically penetrate the carrier gas chamber 98.

A carrier gas supply hole 99 is formed in the carrier gas chamber 98. The carrier gas supply hole 99 communicates with the gas supply pipe 85 (see FIG. 3) so that the first carrier gas 88 is supplied from the gas supply pipe 85 to the carrier gas chamber 98 through the carrier gas supply hole 99.

An atomizer injection port 101 (hereinafter, simply referred to as an injection port) as a first injection port which is in parallel with a leading end of the spray nozzle 96 and allows the carrier gas chamber 98 and the vaporization chamber 65 to communicate with each other is formed on a lower surface of the carrier gas chamber 98. The injection port 101 is formed around the spray nozzle 96. The leading end of the spray nozzle 96 slightly protrudes from an opening of the injection port 101, for example, the leading end of the spray nozzle 96 protrudes from the opening of the injection port 101 by about 0.5 mm. However, although the leading end of the spray nozzle 96 protrudes, the injection port 101 is installed so as to surround the leading end thereof, and since the first carrier gas supplied from the injection port 101 is at high speed, the probability of adhesion to the periphery is extremely low. It is needless to say that the leading end of the spray nozzle 96 may also be included as the first injection port.

Furthermore, the inner diameter of the injection port 101 is extremely smaller than the inner diameter of the carrier gas supply hole 99, and the flow velocity of the first carrier gas 88 injected from the injection port 101 is higher than the flow velocity of the liquid precursor 63 injected from the leading end of the spray flow passage 97.

When the liquid precursor 63 is vaporized by the vaporizer 56, the liquid precursor 63 which is adjusted in flow rate by the LMFC 61 (see FIG. 3) is supplied from the gas supply pipe 45 to the spray flow passage 97, and the first carrier gas 88 which is adjusted in flow rate by the MFC 86 (see FIG. 3) is supplied from the gas supply pipe 85 to the carrier gas chamber 98 via the carrier gas supply hole 99.

At this time, since the inner diameter of the injection port 101 is smaller than the inner diameter of the carrier gas supply hole 99, the internal pressure of the carrier gas chamber 98 is high. For example, it is desirable that the injection port 101 be 30 to 300 μm, the inner diameter of the carrier gas supply hole 99 be 1.75 to 9.53 mm, and the ratio be 50 to 300. For example, in this embodiment, the inner diameter of the injection port 101 is 75 μm.

The first carrier gas 88 of the carrier gas chamber 98 which has come into high pressure is further compressed and accelerated when passing through the injection port 101, and injected into the vaporization chamber 65. The liquid precursor 63 supplied to the spray flow passage 97 is also injected into the vaporization chamber 65 from the leading end of the spray flow passage 97.

At this time, a large speed difference occurs between the liquid precursor 63 and the first carrier gas 88 at the outlet portion (liquid outlet) of the spray flow passage 97 and the outlet portion of the injection port 101. Therefore, as the liquid precursor 63 is torn off by the high-speed first carrier gas 88, the liquid precursor 63 is split and atomized to generate a mist in which the atomized liquid precursor 63 and the first carrier gas 88 are mixed. The mist is sprayed into the vaporization chamber 65 as a high-speed, high-pressure gas-liquid two-layer flow 103.

In this embodiment, the initial velocity of the outlet of the injection port 101 can be increased even at a small flow rate, and the high-speed injection can be performed by increasing the speed, which can contribute to miniaturization of droplets. Thus, improvement in vaporization efficiency can be expected, and as a result, the large flow rate of the vaporized gas (precursor gas) can be expected.

Furthermore, in this embodiment, since the ratio of the inner diameter of the injection port 101 to the inner diameter of the carrier gas supply hole 99 is adjusted to 50 to 300, there is no case where the spray (atomized) state due to excessive decrease in the nozzle injection speed is bad and the mist diameter increases, making the vaporization efficiency deteriorate. It may also be considered that when the nozzle injection speed is excessively increased, the mist may be scattered around the nozzle, for example, which may have an adverse effect on the nozzle injection performance due to adhesion to the injection port 101. However, there is no need to examine the influence of blocking of the injection port 101 due to such mist adhesion.

Furthermore, in this embodiment, the outlet portion (leading end portion) of the spray flow passage 97 and the outlet portion (opening portion) of the injection port 101 are set to the same height or to be slightly higher, but the present disclosure is not limited to this embodiment. If the liquid has low viscosity, the outlet portion of the spray flow passage 97 may be drawn into the nozzle holder 95. For example, the drawing amount is 0.5 to 1 mm. In this case, since the first carrier gas 88 and the liquid precursor 63 are more surely mixed together, the improvement in efficiency of mist formation is expected. As a result of improving the efficiency of mist formation, it is expected that the vaporization efficiency will be improved.

Figure 5:
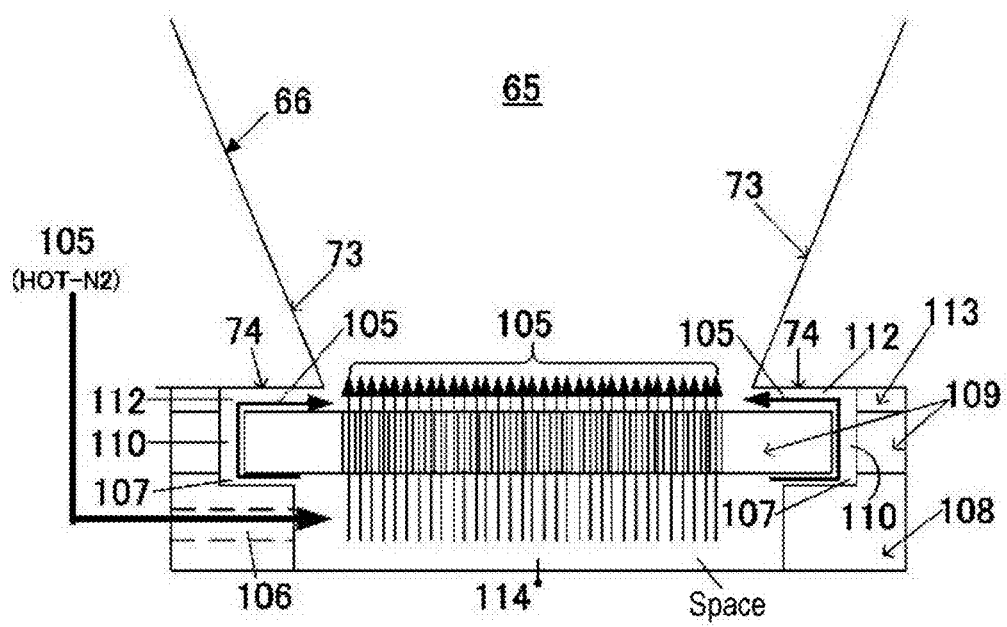
FIG. 5 is a diagram illustrating an example of a second fluid supply part of the vaporizer suitably used in an embodiment of the present disclosure.

As illustrated in FIG. 5, the second fluid supply part is installed on an opposing side of the first fluid supply part for supplying the mixed fluid obtained by mixing the first carrier gas (inert gas) 88 and the liquid precursor gas to the vaporization chamber 65, and is configured to supply the second carrier gas (inert gas) 105 from the outer peripheral side toward the center side on a surface of a plate member 109 as a Blow-Up plate (B. UP plate) installed in the lower portion of the vaporization chamber 65 toward the mixed fluid.

In addition, the second fluid supply part includes at least a gas introduction member 108 having a carrier gas introduction hole 106 for introducing the second carrier gas 105 into the vaporizer 56 and carrier gas introduction grooves 107 for forming a flow passage of the second carrier gas, an injection hole (second injection hole) 111 for injecting the second carrier gas 105 into the vaporization chamber 65, plate members 109 as lower surface portions which are located on the outer circumference side of the second injection hole 111 and each have a plurality of holes 110 as openings which communicate with the carrier gas introduction grooves 107 to form a flow passage that bypasses the second injection hole 111, notches (slits) 112 communicating with the holes 110, and ring members 113 as annular rings (slit rings) for supplying the second carrier gas 105 to the vaporization chamber 65 through the notches 112.

Thereafter, the plate member 109 may be referred to as a shower plate and the ring member 113 may be referred to as a shower plate spacer. Furthermore, the plate member 109 is installed in a lower portion of the vaporization chamber 65 (or the vaporization tube 66), and also constitutes one end portion of the vaporization chamber 65 (or the vaporization tube 66). As illustrated in FIG. 5, for each member, the ring member 113 is disclosed as the ring portion, the plate member 109 is disclosed as the plate portion, and the gas introduction member 108 is disclosed as the gas introduction portion. Although not illustrated, the respective members are fixed by screws. Furthermore, the pressure sensor 114 detects the pressure of the second fluid supply part. The pressure sensor 114 will be described later.

Figure 9:
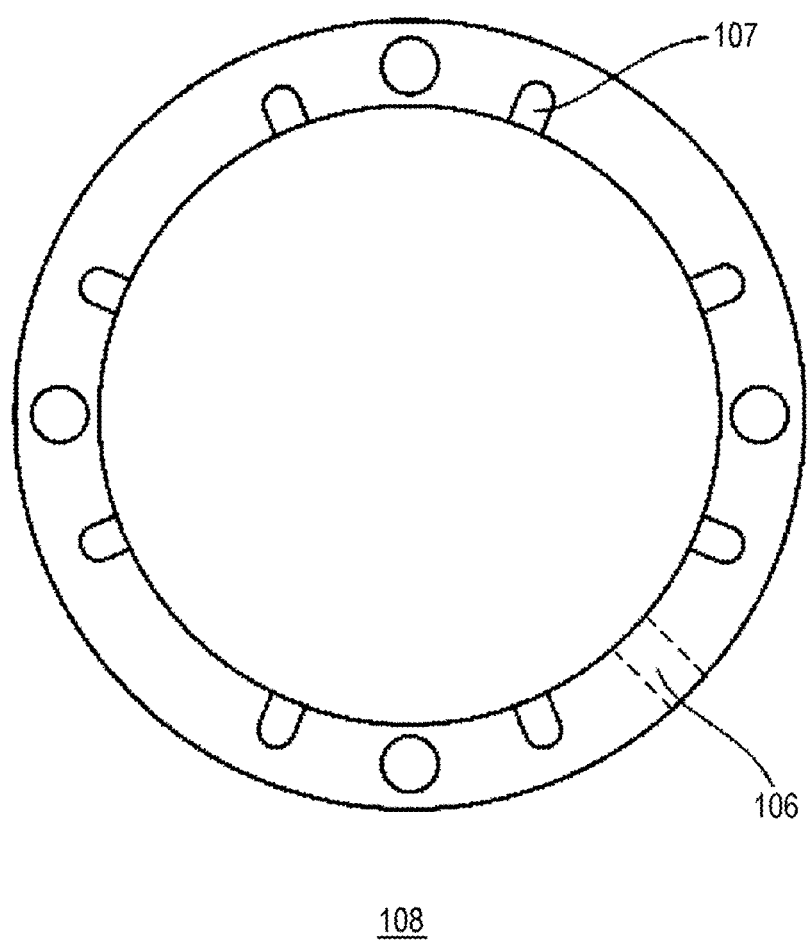
FIG. 9 is a diagram illustrating components constituting the vaporizer suitably used in an embodiment of the present disclosure.
Figure 10:
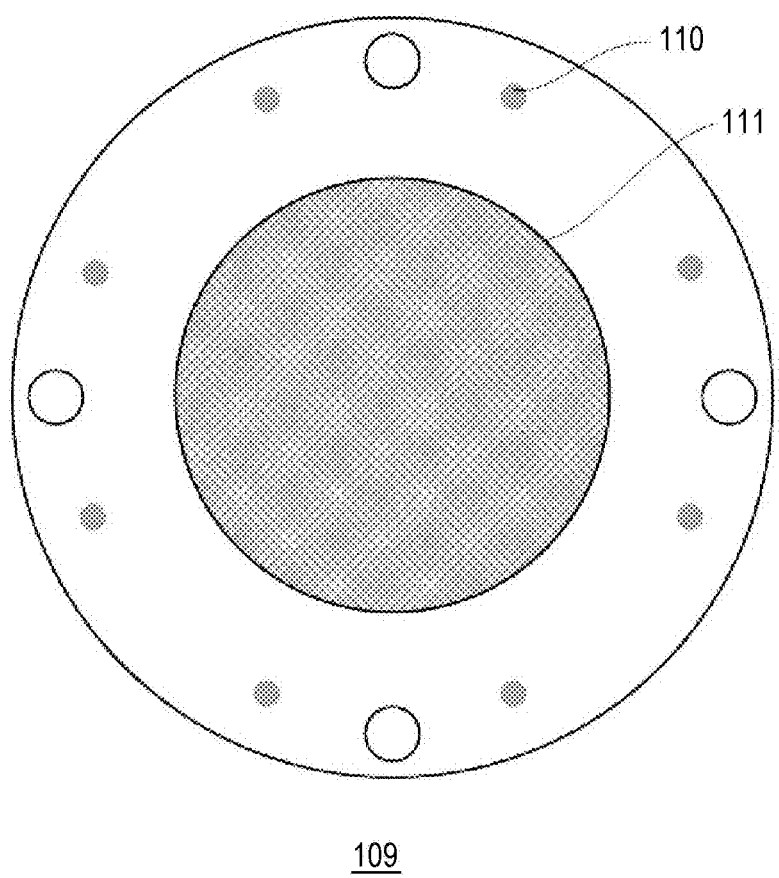
FIG. 10 is a diagram illustrating components constituting the vaporizer suitably used in an embodiment of the present disclosure.
Figure 11:
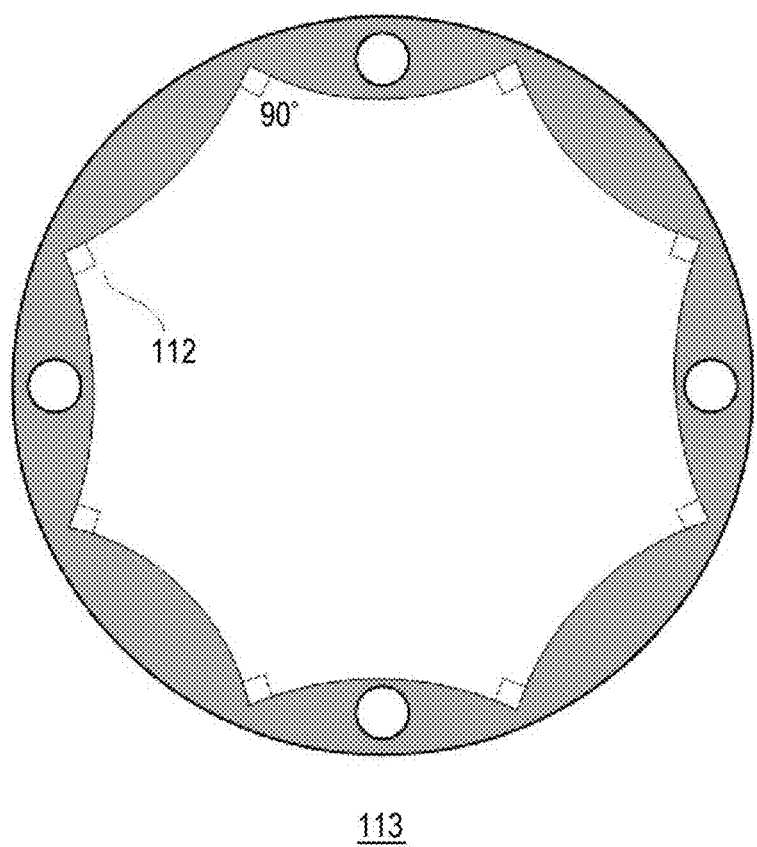
FIG. 11 is a diagram illustrating components constituting the vaporizer suitably used in an embodiment of the present disclosure.

Here, each member will be described. As illustrated in FIG. 11, the diameter of the carrier gas introduction grooves 107 installed in the gas introduction member 108 as the gas introduction part is 2 mm as an example, and for example, the carrier gas introduction grooves 107 are formed equally at eight places in the circumferential direction. As illustrated in FIG. 10, in the plate members 109, numerous injection holes 111 as second injection holes are formed in a circular shape from the center of the plate members 109. The diameter of the injection holes 111 is, for example, 0.1 mm. In the plate members 109, the holes 110 are formed at positions on an outer peripheral side of the injection holes 111 formed in a circular shape. Since the holes 110 are installed in a peripheral edge portion of the plate member 109, the mixed fluid injected from the first injection port does not directly reach the plate member 109. The holes 110 are also installed equally at eight places in the circumferential direction. As illustrated in FIG. 9, the annular ring portions as the shower plate spacers, for example, the notches 112, are installed equally at eight places in the circumferential direction. The angle of the notches is 90°. Furthermore, the number of the notches 112 and the angle of the notches 112 may be appropriately changed.

With this configuration, as illustrated in FIG. 5, the second fluid supply part supplies the second carrier gas 105 to a space having the gas introduction part and the plate portion through the carrier gas introduction hole 106, and the second carrier gas 105 supplied to the space is supplied to the vaporization chamber 65 in order to vaporize the mixed fluid 103 upward (vertically) from the second injection hole 111 formed in the plate portion. On the other hand, the second carrier gas 105 rises from the space having the gas introduction part and the plate portion to the opening formed in the plate portion through the carrier gas introduction grooves 107 and is supplied to the surface of the plate portion in the horizontal direction by changing the direction of the flow by a guide portion 74 installed so as to extend from the lowest portion of the tapered portions 73 of the vaporization tube 66 in the radial direction. That is, since the second fluid supply part is configured to supply the second carrier gas 105 to the surface of the plate portion through the notches 112 communicating with the holes 110, it can supply the second carrier gas to the surface of the plate portion by bypassing the second injection hole even if clogging occurs in the second injection hole.

It is configured such that the opening sectional area of the second injection hole (e.g., a sectional area of an injection hole part) is the same as or slightly smaller than the area of the lowest portion of the tapered portions 73 installed in the vaporization tube 66 (the opening sectional area of the guide portion 74 in the lower portion of the vaporization tube 66).

When the mixed fluid injected from the first injection port collides with the plate portion, it is decomposed and scattered, but the heated second carrier gas 105 is supplied not only vertically but also horizontally on the surface of the plate member. Thus, it is possible to prevent adhesion to the peripheral inner wall of the vaporization tube 66 and clogging of the second injection hole on the surface of the plate member.

Furthermore, since the holes (openings) 110 are located at positions where the mixed fluid does not directly reach, the supply amount of the Hot-N2 gas to the second injection hole 111 increases even when the second injection hole 111 is clogged, thereby suppressing adhesion of the mist even at the clogging portion of the hot gas injection region on the surface of the plate.

Here, the balance between the flow rate of the mixed fluid supplied from the first injection port and the flow rate of the Hot-N2 gas 105 supplied from the second injection hole 111 is optimized. For example, the amount of residue adhered to the plate portion is set to a region of 1:7 or less in the ratio of the discharge rate of the first injection port and the discharge rate of the second injection port.

In addition, the pressure sensor 114 is installed in the space between the gas introduction part and the plate portions as the shower plates. By recording the value of the pressure sensor 114, clogging determination of the second injection hole 111 formed at the center of the plate portion is performed. It is also needless to say that the example illustrated in FIG. 5 is an example. In this manner, the maintenance timing of the vaporizer 56 can be determined based on the pressure value.

According to this embodiment, the second fluid supply part is configured to supply the second carrier gas 105 from the outer peripheral side of the plate portion toward the center side in the horizontal direction on the surface of the bottom surface portion of the vaporization tube 66. Thus, in a region where the second injection hole 111 does not exist (between the holes), the probability of mist adhesion is high, and thus, even if the mist adheres and deposits, since the second carrier gas 105 can be supplied to the surfaces of the shower plates before closing the second injection hole 111 in the region where the second injection hole 111 of the shower plate exists, it is possible to efficiently vaporize even the mist adhered to the region where the second injection hole 111 does not exist. It is also possible to suppress generation of residue around the shower plates. The bottom surface portion may also be included in the plate member 109.

According to this embodiment, since the second fluid supply part is configured to supply the second carrier gas 105 from the outer peripheral side of the plate portion toward the center side in the horizontal direction on the surface of the bottom surface portion of the vaporization tube 66, in a region where the second injection hole 111 does not exist (between the holes), the probability of mist adhesion is high, and thus, even if the mist adheres and deposits, it is possible to vaporize the mist before closing the second injection hole 111 in the region where the second injection hole 111 of the shower plates exists. Thus, the flow rate of the mist injected can be increased, thereby increasing the flow rate of vaporized gas once generated by the vaporizer 56.

According to this embodiment, since the flow passage of the second carrier gas supplied from the holes 110 communicating with the gas introduction member 108 to the surfaces of the shower plates through the notches 112, to the surfaces of the shower plates, is secured by the guide portion 74 installed in the vaporization tube 66, it is possible to efficiently vaporize the mist adhered to the surfaces of the shower plates, irrespective of clogging of the second injection hole 111. Furthermore, since the holes 110 are located at positions where the mist does not directly adhere, there is no concern of clogging, and thus, the improvement in performance of the vaporizer 56 and the improvement in reliability of the device can be expected.

According to this embodiment, since the holes 110 are located at positions where the mist does not directly adhere, even if clogging occurs in the second injection hole 111, since the flow passage of the second carrier gas supplied from the holes 110 communicating with the gas introduction member 108 to the surfaces of the shower plates through the notches 112, to the surfaces of the shower plates, is secured by the guide portion 74 installed in the vaporization tube 66, it is possible to vaporize the mist adhered to the surfaces of the shower plates. As described above, even if clogging occurs in the second injection hole 111, the improvement in reliability of the device can be expected while maintaining the performance of the vaporizer 56.

In this embodiment, the second carrier gas 105 can be supplied to the surfaces of the shower plates in the horizontal direction by forming the gas flow passage formed in the second fluid supply part so as to bypass the second injection hole 111, and as a result, even if the mist adheres to the region where the second injection hole 111 does not exist, the reduction of the aperture area of the shower plates and the deterioration of the vaporization efficiency are suppressed as much as possible. Thus, since the aperture area does not decrease as the deposition amount gradually increases, it is possible to suppress occurrence of pressure rise.

According to this embodiment, since the second fluid supply portion can supply the second carrier gas 105 into the vaporization chamber 65 through the flow passage bypassing the second injection hole 111, even if clogging occurs in the second injection hole 111, since fluctuation of the detection value of the pressure sensor 114 illustrated in FIG. 5 is small, it is possible to increase the number of times of continuous use of the vaporizer 56. Thus, according to this embodiment, the reliability of the device is improved while maintaining the vaporization performance of the vaporizer 56.

FIG. 12 is a graph comparing the supply pressure of the second carrier gas (Hot-N2 gas) of the conventional vaporizer with the supply pressure of the second carrier gas (Hot-N2 gas) 105 of the vaporizer according to the present disclosure. The conventional vaporizer (hereinafter, referred to as a conventional product) is configured to supply a heated inert gas (Hot-N2 gas) 105 into the vaporization chamber 65 only from the second injection hole 111, and the vaporizer of the present disclosure (hereafter, referred to as a disclosure product) is configured to supply the gas to the surface of the plate member 109 in the vaporization chamber 65 not only from the second injection hole 111 but also through the carrier gas introduction grooves 107 of the gas introduction part, the holes 110 for forming the flow passage installed on the outer peripheral side of the second injection hole 111 of the plate member 109, and the notches 112 of the shower plate spacer.

In the test of the vaporizer 56, in both the conventional product and the disclosure product, the flow rate of a precursor (source) gas is 2.0 to 4.0 g/min, and the precursor supply (Vapor FLOW) for 2 minutes (2.0 min) and the purge gas supply ($N_2$ purge) for 1 minute (1.0 min) are set as one cycle and 24 to 47 cycles are implemented. Here, the test conditions shown in FIG. 12 are that the precursor (Zr source) gas is a TEMAZ gas, the flow rate of the precursor gas is 3.0 g/min, and 47 cycles are implemented.

As shown in FIG. 12, the gas supply pressure increases as the number of times of use (cycle) increases in the conventional product, whereas the pressure fluctuation hardly occurs in an embodiment disclosed in the present disclosure (disclosure product) even if the number of times of use increases. In short, in the conventional product, since clogging of the opening of the second injection hole 111 occurs as the number of times of use (cycle) increases, in order to maintain the performance of the vaporizer 56 (in order to vaporize the mixed fluid), since the supply amount of the second carrier gas is maintained, it can be seen that the gas supply pressure increases. On the other hand, in the disclosure product, the pressure fluctuation hardly occurs even if the number of times of use increases. That is, it can be seen that clogging of the second injection hole 111 does not occur in the disclosure product. For example, even if clogging occurs, since the second carrier gas 105 can be supplied through the flow passage bypassing the second injection hole 111, it is possible to vaporize the mist adhered to the second injection hole 111.

As described above, according to this embodiment, one or more effects among (a) to (j) as set forth below may be achieved.

(a) According to this embodiment, since the vaporizer is configured to turn a liquid precursor that cannot be vaporized by adiabatic expansion into a mist-like droplet, the time until vaporization is made in the vaporization chamber is shortened, and the liquid precursor reacts in the vaporization chamber or a byproduct is formed. This makes it possible to reduce residue remaining within the vaporization chamber.

(b) According to this embodiment, since the pressure of the liquid precursor in the spray flow passage of the first fluid supply part is higher than the internal pressure of the vaporization chamber, the liquid precursor can be easily atomized and vaporized even in a depressurized field (high vacuum field) where the interior of the vaporization chamber is depressurized.

(c) According to this embodiment, since the increase in pressure in the spray flow passage of the first fluid supply part and the reduction in pressure in the vaporization chamber are possible, the liquid precursor can be sprayed into the vaporization chamber in a wide pressure range and residue remaining within the vaporization chamber can be reduced.

(d) According to this embodiment, since the vaporizer is configured to supply the heated inert gas to the mixed fluid obtained by mixing the liquid precursor sprayed into the vaporization chamber and the first carrier gas by installing the second fluid supply part at an opposing position of the first fluid supply part for supplying the mixed fluid into the vaporization chamber, namely at a position where the heated inert gas is supplied, it is possible to remarkably improve the vaporization efficiency and to remarkably reduce residue remaining within the vaporization chamber.

(e) According to this embodiment, since the vaporizer is configured such that the aperture area of the second injection hole formed in the second fluid supply part and the sectional area of the lower portion of the vaporization tube are approximated, and taper processing from the lower portion thereof to the vicinity of communication ports of the vaporization tube is performed to secure the gas flow passage by the communication ports, it is possible to improve the heat transfer efficiency from the wall surface of the vaporization tube and to remarkably reduce the stagnation region of the gas flow.

(f) According to this embodiment, since the second fluid supply part is configured to spray the heated inert gas into the vaporization chamber through the plate member having the second injection hole installed in the second fluid supply part and horizontally supply the heated inert gas to the surface of the plate member, it is possible to remarkably improve the vaporization efficiency and to suppress clogging of the injection hole of the plate.

(g) According to this embodiment, when comparing the flow rate of the mixed fluid supplied from the first fluid supply part and the flow rate of the heated inert gas supplied from the second fluid supply part, it is configured such that the flow rate of the inert gas supplied from the second fluid supply part is set to be larger. Thus, it is possible to improve the vaporization efficiency and to suppress clogging of the injection hole of the plate. In particular, when it is configured such that the flow rate ratio of the flow rate of the gas supplied from the first fluid supply part and the flow rate of the gas supplied from the second fluid supply part is 1:7 or less, it is possible to improve the vaporization efficiency and to suppress clogging of the injection hole of the plate.

(h) According to this embodiment, since the second fluid supply part is configured to horizontally supply the heated inert gas to the surface of the plate portion by bypassing the injection hole formed on the surface of the plate portion, it is possible to improve the vaporization efficiency by vaporizing the mixed fluid adhered to the plate portion. For example, even if the mixed fluid adheres to a region where the injection hole does not exist in the plate portion, it is possible to perform vaporization before clogging occurs by supplying the heated inert gas to the surface of the plate portion.

(i) According to this embodiment, since the second fluid supply part has a structure in which the gas introduction part, the plate portion and the ring portion are laminated, the heated inert gas can be supplied to the surface of the plate by bypassing the injection hole. Thus, it is possible to suppress the pressure rise due to clogging of the injection hole and to maintain the performance of the vaporizer for a long period of time.

(j) According to this embodiment, since it is configured such that the inert gas introduced into the second fluid supply part is horizontally supplied to the surface of the plate portion in the vaporizer through the carrier gas introduction grooves of the gas introduction part, the holes for forming the flow passage formed at outside side of the injection hole of the plate portion and the notches of the ring portion, even if the mixed fluid supplied from the first fluid supply part adheres to a region where the hole does not exist in the plate portion, it is possible to perform vaporization with the inert gas and to improve the vaporization efficiency. In addition, it is possible to suppress reduction of the aperture area due to clogging of the injection hole of the plate portion caused by the mixed fluid adhered to the region where the hole does not exist in the plate portion. Thus, it is possible to suppress the pressure rise due to the clogging of the injection hole and to maintain the performance of the vaporizer for a long period of time.

Second Embodiment

Figure 13A:
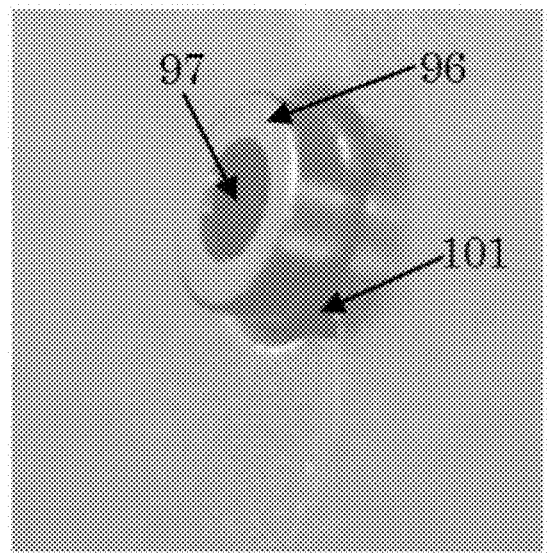
FIG. 13A is a diagram illustrating the periphery of a nozzle in a new product according to the first embodiment of the present disclosure.

It is possible to perform high-speed injection with a small amount of inert gas by reducing the sectional area of the injection port 101 as illustrated in FIG. 13A, from the shapes of the nozzle 96 and the injection port 101 according to the first embodiment.

Figure 13B:
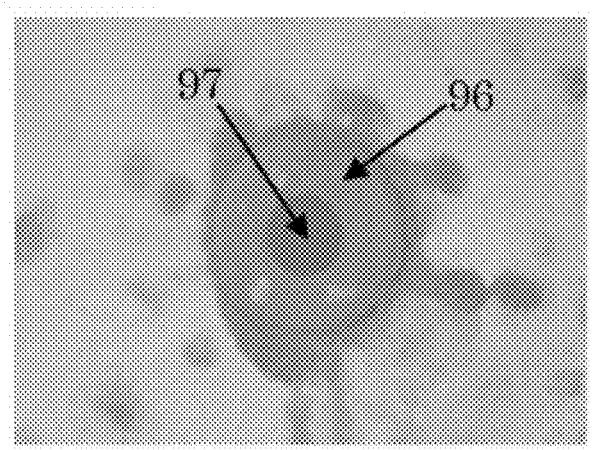
FIG. 13B is a diagram illustrating the periphery of the nozzle after long-term operation according to the first embodiment of the present disclosure.

However, in this configuration, since the mist generated at the leading end of the nozzle 96 is scattered not only vertically but also in all the directions, it adheres to the leading end of the nozzle 96, the main body of the nozzle 96 and the periphery of the injection port 101 to become residue. As illustrated in FIG. 13B, after long-term operation, in proportion to the accumulation of the spraying time, the residue causes blocking of the injection port 101 and an atomizing failure due to residue deposited in large amount almost in the entire region of the nozzle holder 95, the above portion and its surroundings, which was a factor of deterioration of vaporization performance of the vaporizer 56. Furthermore, the pressure rise value of the supply pressure of the first carrier gas at this time was 6 to 7 KPa.

Figure 14:
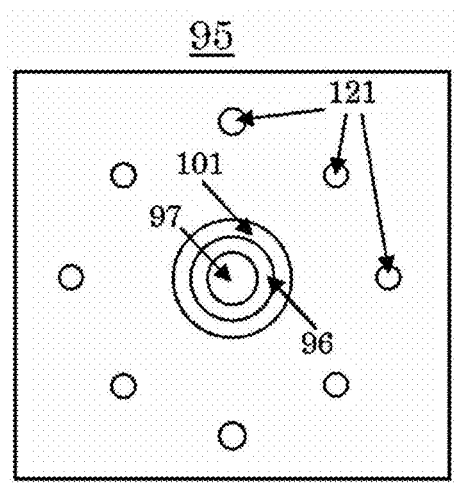
FIG. 14 is a front view illustrating components constituting a vaporizer suitably used in a second embodiment of the present disclosure.

First, the configuration of the nozzle holder 95 according to the second embodiment was changed. Specifically, as illustrated in FIG. 14, it is configured such that a plurality of purging holes 121 as purge holes are formed around the nozzle 96 so that the purge gas (e.g., the inert gas) can be supplied around the nozzle 96. These combine with a nozzle plate cover 122 (hereafter, simply referred to as a cover), thereby achieving the effect of removing the mist adhesion as described hereinbelow.

Figure 15:
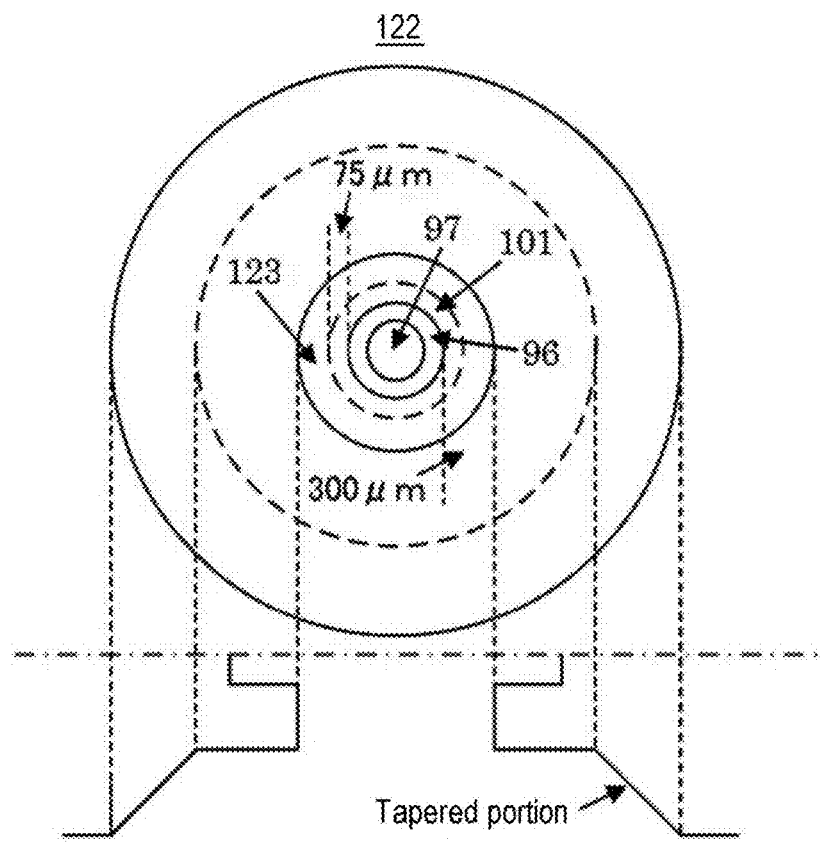
FIG. 15 is a diagram illustrating components constituting the vaporizer suitably used in the second embodiment of the present disclosure.

Furthermore, FIG. 15 is a front view illustrating a configuration of the cover 122 as a protective member. In order to describe the cover 122, this front view is a view illustrating the configuration of the vicinity of the nozzle 96 and the purging holes 121 when attached to the nozzle 96 and the nozzle holder 95. As illustrated in FIG. 15, the diameter of a cylindrical opening 123 as an annular port formed between the nozzle 96 and the cover 122 is 300 μm, while the diameter of the injection port 101 is 75 μm. In addition, the cover 122 is configured such that the region of the mist generated at the leading end of the nozzle 96 and flowing into the nozzle holder 95 is limited to the cylindrical opening 123 of 300 μm excluding the sectional area of the nozzle. The cylindrical opening 123 can be made smaller according to the adhesion state of the mist, but is configured to be equal to or larger than the opening (in this case, 75 μm) of the injection port 101 due to restriction of the vaporization performance. Furthermore, since it is configured such that the purge gas is supplied from the cylindrical opening 123 into the vaporization chamber 65, mist adhesion does not occur at the leading end of the nozzle 96 and at a cylindrical portion of the nozzle 96, thereby improving the effect of removing the mist adhesion as described hereinbelow. Thus, blocking of the injection port 101 does not occur.

Figure 16:
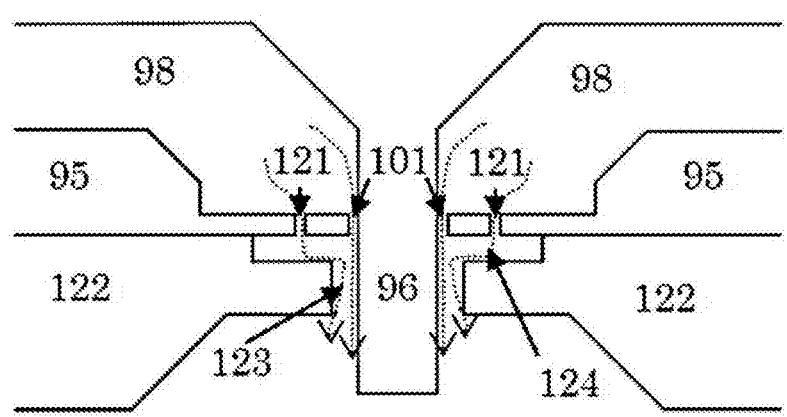
FIG. 16 is a diagram illustrating a main part of a first fluid supply part in the vaporizer suitably used in the second embodiment of the present disclosure.

FIG. 16 is a cross sectional view illustrating a configuration of a first fluid supply part according to the second embodiment in which the nozzle plate cover 122 is installed in the nozzle holder 95. This configuration includes at least a nozzle 96, a nozzle holder 95 configured to form a plurality of holes 121 around the nozzle 96, and a cover 122 installed so as to cover the nozzle holder 95. The dotted line indicated in FIG. 16 schematically shows the flow passage of the first carrier gas.

Therefore, the inert gas supplied to the injection port 101 is directly supplied to the vaporization chamber 65 via the cylindrical opening 123, thereby misting the liquid precursor 63 as in the first embodiment. After the inert gas supplied from the plurality of holes 121 passes through a space 124 as a purge space (hereinafter, referred to as a space inside the plate cover) configured in the cover 122, similar to the inert gas for misting the liquid precursor 63, it is configured to allow the inert gas to flow into the vaporization chamber 65 from the cylindrical opening 123. With this configuration, two different gas flows due to the inert gas supplied from the injection port 101 and the inert gas supplied from the holes 121 join near the boundary between the cylindrical opening 123 and the space 124 so as to exist around cylindrical opening 123.

Next, the flow of the inert gas as the first carrier gas 88 in the main part of the first fluid supply part according to the second embodiment illustrated in FIG. 16 will be described. First, the carrier gas chamber 98 is filled with the inert gas. Then, the pressurized inert gas passes through the injection port 101 and the purge holes 121.

Subsequently, as indicated by the dotted line in FIG. 16, the inert gas injected from the injection port 101 passes through the purge space 124 and the cylindrical opening 123, reaches the leading end of the nozzle 96 and atomizes the liquid precursor 63 at the leading end of the nozzle 96 to mist the same. At this time, the inert gas injected from the injection port 101 is configured to contribute to misting of the liquid precursor 63 without decreasing its speed (while maintaining a high speed)

On the other hand, as indicated by the dotted line in FIG. 16, the inert gas that has passed through the purge hole 121 collides with the cover 122 through the purge space 124. Therefore, the direction of the inert gas is changed to the direction of the nozzle 96 at a decreased speed, and the gas flows along the periphery thereof in the purge space 124, and joins the inert gas injected from the injection port 101 around the cylindrical opening 123 to supply it to the vaporization chamber 65. This gas flow can create the mist adhesion removal increase effect of forming a mist adhesion protective layer directly below the injection port 101 and its circumferential portion, and discharging the mist flowing from the cylindrical opening 123 from the cylindrical opening 123.

As described above, according to the first fluid supply part A in this embodiment (second embodiment), by supplying the inert gas from the purge hole 121 in addition to the injection port 101 in the first embodiment, the mist atomized at the leading end of the nozzle 96 adheres to the periphery of the cylindrical opening 123 of the cover 122 and the tapered surface of the cover 122 and the leading end of the nozzle 96, which may be just a small amount of adhesion to the vicinity of the injection port 101 and the cylindrical portion of the nozzle. Thus, the blocking of the injection port 101 and the effect of suppressing adhesion to the cylindrical portion of the nozzle can be greatly improved in comparison with the first embodiment.

(Verification Results in Second Embodiment)

FIG. 17 shows the results of verifying the vaporization performance of the vaporizer 56 by changing the configuration of the first fluid supply part A from the first embodiment to the second embodiment.

In FIG. 17, the left column (described as a vaporizer A) shows the effect on residue of the first fluid supply part (particularly, around the nozzle 96) with the configuration of only the injection port 101 of the nozzle 96. In FIG. 17, the right column (described as a vaporizer B) shows the effect of residue on the first fluid supply part (particularly, around the nozzle 96) when changing to the nozzle holder 95 of the vaporizer A and to a structure in which the nozzle plate cover 122 is installed.

In the test of the vaporizer 56, in both the vaporizer A and the vaporizer B, the flow rate of a precursor (source) gas is 3.0 g/min, the precursor supply (Vapor FLOW) of 2 minutes (2.0 min), the purge gas supply ($N_2$ purge) for 1 minute (1.0 min) and the gas exhaust (VACUUM) for 1 minute (1.0 min) are set as one cycle, and the vaporizer A was implemented 375 cycles and the vaporizer B was implemented 320 cycles. As a result of setting a threshold value of the pressure rise value of the supply pressure of the first carrier gas by the pressure sensor to 1 KPa or less, the pressure of the vaporizer A increased by 6 KPa, while the pressure of the vaporizer B increased by only 600 Pa (less than 1 KPa).

Even with the vaporizer A, although the residual amount is reduced, in consideration of long-term operation, the residual quantity increased in the nozzle holder 95 and at the leading end of the nozzle 96 and the pressure rise increased compared with the set value (1 KPa). On the other hand, even after repeating 320 times in the vaporizer B, the residual amount was also very small and the pressure rise was suppressed to less than 1 KPa. Therefore, in consideration of practical application, the vaporizer B can be applied to the long-term operation because the pressure rise is small.

Furthermore, in the vaporizer B, a very small amount of residue was found in the nozzle holder 95 and at the leading end of the nozzle 96, but residue was not adhered to the cylindrical portion of the nozzle 96. That is, it indicates that the injection port 101 was not blocked at all. In addition, according to FIG. 17, it indicates that a small amount of residue was attached to the periphery of the cover 122, and that the performance of the first fluid supply part A is maintained.

As described above, in the second embodiment, by forming the plurality of purging holes 121 in the configuration of the first fluid supply part A, it is possible to reduce the residual amount, and by installing the cover 122, it is also possible to ensure the performance maintenance even after the long-term operation of the vaporizer 56 and to promote the improvement in reliability of vaporization performance.

Furthermore, in the second embodiment, since the configuration of the second fluid supply part B is the same, a detailed description thereof will be omitted. Also, in the second embodiment, since the configuration of the second fluid supply part is the same, the effect of the first embodiment is included. However, the configuration of the second fluid supply part B is not limited to this embodiment.

As described above, according to this embodiment (second embodiment), in addition to including at least one or more effects of the effects of the first embodiment, one or more effects among (k) to (n) as set forth below may be achieved.

(k) According to this embodiment, by forming the plurality of purging holes in addition to the injection port in the nozzle holder, it is possible to suppress adhesion of mist to the nozzle and the cylindrical portion of the nozzle and to reduce the amount of residue around the injection port.

(l) According to this embodiment, by installing the nozzle holder so as to be covered with the nozzle plate cover, the region where the mist flows into the nozzle holder is limited to the opening of 300 μm excluding the sectional area of the nozzle. Thus, it is possible to suppress the adhesion of mist to the nozzle and the cylindrical portion of the nozzle and to reduce the amount of residue around the injection port.

(m) According to this embodiment, since the gas flows having different flow passages are always present around the nozzle and the opening of the nozzle plate cover, it is possible to suppress adhesion of mist to the nozzle and the cylindrical portion of the nozzle, which is a factor of deterioration of atomizing performance, and to reduce the amount of residue around the injection port.

(n) According to this embodiment, by forming the plurality of purging holes in addition to the injection port in the nozzle holder and also installing the nozzle holder so as to be covered with the nozzle plate cover, it is possible to suppress adhesion of mist to the nozzle and the cylindrical portion of the nozzle, which is a factor of deterioration of atomizing performance, and to provide a vaporization system that can reduce the amount of residue around the injection port and can extend the lifetime of atomizing performance.

Moreover, in this embodiment, TEMAZ is used as the liquid precursor 63, but other Zr precursors such as tetrakisdiethylamino zirconium (TDEAZ, $Zr[N(C_2H_5)_2]_4$) or tetrakisdimethylamino zirconium (TDMAZ, $Zr[N(CH_3)_2]_4$) may be used to form a ZrO film.

In addition, the substrate processing apparatus according to the embodiment of the present disclosure may be applied to any film type other than ZrO so long as it is a film type using a precursor having a low vapor pressure. For example, the substrate processing apparatus according to the present embodiment may also be applied to a process of forming a nickel film (Ni film) on a wafer 6 using Ni-amidinate as a gas species and a process of forming a cobalt film (Co film) on a wafer 6 using Co amidinate as a gas species.

The present disclosure relates to a technique of supplying a vaporized gas obtained by vaporizing a liquid precursor, and particularly, can be applied to a substrate processing apparatus that performs a predetermined process on a substrate using a vaporized gas obtained by vaporizing a liquid precursor.

According to the present disclosure in some embodiments, it is possible to achieve an excellent effect that the vaporization performance can be remarkably reduced while reducing residue in a vaporizer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vaporizer comprising:
a vaporization chamber having a tapered first portion and a tapered second portion;
a first fluid supply part connected to the tapered first portion of the vaporization chamber, and configured to supply a mixed fluid, in which a first carrier gas from an injection port and a liquid precursor in a mist state are mixed, toward the tapered second portion;
a second fluid supply part including a first plurality of holes formed at a center portion of the second fluid supply part and the tapered second portion and configured to supply a second carrier gas toward the mixed fluid, and a second plurality of holes formed around a circumference of the first plurality of holes and configured to send a flow passage of gas along the tapered second portion; and
one or more discharge holes installed on a sidewall of the vaporization chamber configured to supply a precursor gas to a process chamber,
wherein the first fluid supply part includes at least a nozzle configured to supply the liquid precursor,
wherein the first fluid supply part is configured such that the first carrier gas, which has passed through the injection port, passes through an opening of the injection port, reaches a leading end of the nozzle, and converts the liquid precursor into the mist state,
wherein the second fluid supply part is configured such that the second carrier gas is supplied from the first plurality of holes toward the mixed fluid of the first carrier gas and the liquid precursor in the mist state,
wherein the flow passage of gas, which includes the second carrier gas from the second plurality of holes, any of the second carrier gas from the first plurality of holes, the mixed fluid, and a vaporized gas that is vaporized from the mixed fluid by the second carrier gas, is formed on the sidewall of the vaporization chamber, and
wherein the precursor gas, which includes any of the second carrier gas, the mixed fluid, and the vaporized gas, flows through the one or more discharge holes, and to the process chamber.

2. The vaporizer of claim 1, wherein the first fluid supply part further includes at least a carrier gas chamber communicating with the vaporization chamber via the injection port, and
wherein the leading end of the nozzle is configured to protrude from the opening of the injection port toward the vaporization chamber.

3. The vaporizer of claim 2, wherein the opening of the injection port is formed around the leading end of the nozzle, and
wherein a flow velocity of the first carrier gas supplied from the opening to the vaporization chamber is higher than a flow velocity of the liquid precursor supplied from the nozzle.

4. The vaporizer of claim 1, wherein the second carrier gas is a heated inert gas.

5. The vaporizer of claim 1, wherein an opening sectional area of a guide portion of the vaporization chamber and a sectional area of the first plurality of holes formed at the center portion of the tapered second portion are equal in size.

6. The vaporizer of claim 1, wherein the one or more discharge holes include a plurality of discharge holes, and
wherein the plurality of discharge holes are formed at an equal interval in a circumferential direction on the sidewall of the vaporization chamber.

7. The vaporizer of claim 1, wherein a sectional area of the first plurality of holes formed at the center portion of the second portion is larger than a sectional area of the injection port at the tapered first portion.

8. The vaporizer of claim 1, wherein the one or more discharge holes are configured such that the mixed fluid, which is supplied from the first fluid supply part, discharges the vaporized gas, which is heated and supplied from the second fluid supply part, from the vaporization chamber.

9. The vaporizer of claim 1, wherein an inner diameter of the injection port is configured to be in a range of 30 to 300 μm.

10. The vaporizer of claim 1, wherein a flow rate of the second carrier gas supplied from the second fluid supply part is seven or more times a flow rate of the mixed fluid supplied from the first fluid supply part.

11. A substrate processing apparatus comprising:
a process chamber configured to accommodate a substrate, and
a precursor gas supply system configured to supply a vaporized gas obtained by vaporizing a liquid precursor by a vaporizer, as a precursor gas, to the process chamber, the vaporizer including:
a vaporization chamber having a tapered first portion and a tapered second portion;
a first fluid supply part connected to the tapered first portion of the vaporization chamber, and configured to supply a mixed fluid, in which a first carrier gas from an injection port and the liquid precursor in a mist state are mixed, toward the tapered second portion;
a second fluid supply part including a first plurality of holes formed at a center portion of the second fluid supply part and the tapered second portion and configured to supply a second carrier gas toward the mixed fluid, and a second plurality of holes formed around a circumference of the first plurality of holes and configured to send a flow passage of gas along the tapered second portion; and
one or more discharge holes installed on a sidewall of the vaporization chamber configured to supply the precursor gas to the process chamber,
wherein the first fluid supply part includes at least a nozzle configured to supply the liquid precursor,
wherein the first fluid supply part is configured such that the first carrier gas, which has passed through the injection port, passes through an opening of the injection port, reaches a leading end of the nozzle, and converts the liquid precursor into the mist state,
wherein the second fluid supply part is configured such that the second carrier gas is supplied from the first plurality of holes toward the mixed fluid of the first carrier gas and the liquid precursor in the mist state,
wherein the flow passage of gas, which includes the second carrier gas from the second plurality of holes, any of the second carrier gas from the first plurality of holes, the mixed fluid, and a vaporized gas that is vaporized from the mixed fluid by the second carrier gas, is formed on the sidewall of the vaporization chamber, and
wherein the precursor gas, which includes any of the second carrier gas, the mixed fluid, and the vaporized gas, flows through the one or more discharge holes, and to the process chamber.

12. A method for manufacturing a semiconductor device by using a vaporizer comprising:
a vaporization chamber having a tapered first portion and a tapered second portion;
a first fluid supply part connected to the tapered first portion of the vaporization chamber, and configured to supply a mixed fluid, in which a first carrier gas from an injection port and a liquid precursor in a mist state are mixed, toward the tapered second portion;
a second fluid supply part including a first plurality of holes formed at a center portion of the second fluid supply part and the tapered second portion and configured to supply a second carrier gas toward the mixed fluid, and a second plurality of holes formed around a circumference of the first plurality of hole and configured to send a flow passage of vas along the tapered second portion; and
one or more discharge holes installed on a sidewall of the vaporization chamber configured to supply a precursor gas to a process chamber,
wherein the first fluid supply part includes at least a nozzle configured to supply the liquid precursor,
wherein the first fluid supply part is configured such that the first carrier gas, which has passed through the injection port, passes through an opening of the injection port, reaches a leading end of the nozzle, and converts the liquid precursor into the mist state,
wherein the second fluid supply part is configured such that the second carrier gas is supplied from the first plurality of holes toward the mixed fluid of the first carrier gas and the liquid precursor in the mist state,
wherein the flow passage of gas, which includes the second carrier gas from the second plurality of holes, any of the second carrier gas from the first plurality of holes, the mixed fluid, and a vaporized gas that is vaporized from the mixed fluid by the second carrier gas, is formed on the sidewall of the vaporization chamber,
wherein the precursor gas, which includes any of the second carrier gas, the mixed fluid, and the vaporized gas, flows through the one or more discharge holes, and to the process chamber,
wherein the method comprising:
forming the precursor gas by:

supplying the liquid precursor and the first carrier gas to the first fluid supply part to form a mist toward the tapered second portion; and supplying the second carrier gas through the first plurality of holes toward the mixed fluid and the second plurality of holes in the second fluid supply part to the flow passage of gas on the sidewall of the vaporization chamber;

supplying the precursor gas to the process chamber that accommodates a substrate;

removing the precursor gas from the process chamber;

supplying a reaction gas to the process chamber from which the precursor gas is removed; and removing the reaction gas from the process chamber.

* * * * *